United States Patent [19]

Agrawal et al.

[11] Patent Number: 5,218,551
[45] Date of Patent: Jun. 8, 1993

[54] TIMING DRIVEN PLACEMENT

[75] Inventors: Bhuwan Agrawal, Chapel Hill, N.C.;
Stephen E. Bello, Kingston, N.Y.;
Wilm E. Donath, Pleasantville, N.Y.;
San Y. Han; Joseph Hutt, Jr., both of
Poughkeepsie, N.Y.; Jerome M.
Kurtzberg, Yorktown Heights, N.Y.;
Roger I. McMillan, Newpulse, N.Y.;
Reini J. Norman, Kingston, N.Y.;
Cyril A. Price, Stone Ridge, N.Y.;
Ralph W. Wilk, Lakeville, Conn.

[73] Assignee: International Business Machines Corporation, Armonk, N.Y.

[21] Appl. No.: 516,944

[22] Filed: Apr. 30, 1990

[51] Int. Cl.5 .................................. G06F 15/60
[52] U.S. Cl. .................... 364/491; 364/490; 364/489; 364/488
[58] Field of Search ............... 364/488, 489, 490, 491

[56]  References Cited

U.S. PATENT DOCUMENTS

| | | | |
|---|---|---|---|
| 1,944,001 | 3/1976 | Hanan et al. | 364/490 |
| 4,263,651 | 4/1981 | Donath et al. | 364/491 |
| 4,593,363 | 6/1986 | Burstein et al. | 364/491 |
| 4,630,219 | 12/1986 | DiGiacomo et al. | 364/491 |
| 4,694,403 | 9/1987 | Nomura | 364/488 |
| 4,698,760 | 10/1987 | Lembach et al. | 364/490 |
| 4,713,773 | 12/1987 | Cooper et al. | 364/491 |
| 4,752,887 | 6/1988 | Kuwahara | 364/491 |
| 4,754,408 | 6/1988 | Carpenter et al. | 364/491 |
| 4,815,003 | 3/1989 | Putatunda et al. | 364/491 |
| 4,823,278 | 4/1989 | Kikuchi et al. | 364/491 |
| 4,827,428 | 5/1989 | Dunlop et al. | 364/491 |
| 4,852,015 | 7/1989 | Doyle, Jr. | 364/491 |
| 4,890,238 | 12/1989 | Klein et al. | 364/491 |
| 4,924,430 | 5/1990 | Zasio et al. | 364/578 |
| 5,077,676 | 12/1991 | Johnson et al. | 364/489 |

OTHER PUBLICATIONS

"Circuit Placement for Predictable Performance", by Hange et al., IEEE 1987, pp. 88-91.
W. I. Fletcher, "An Engineering Approach to Digital Design", Chapter 4, section 15, pp. 261-265, Prentice Hall, Inc. 1980.
Donath, Placement and Average Interconnection Lengths of Computer Logic, IEEE Transactions on Circuits & Systems, vol. 26, No. 4, Apr. 1979, pp. 272-277.
Heller et al., Wirability—Designing Wiring Space for Chips and Chip Packages, IEEE Design & Test, Aug. 1984, pp. 43-51.
Hitchcock, Sr. et al., Timing Analysis of Computer Hardware, IBM Journal of R&D vol. 26, No. 1, Jan. 1983, pp. 100-105.

(List continued on next page.)

Primary Examiner—Vincent N. Trans
Attorney, Agent, or Firm—Charles B. Lobsenz; Blaney Harper; George E. Clark

[57] ABSTRACT

The invention is a method of designing an integrated circuit in which the steps of designing the circuit are optimized by a formal hierarchy. This method, called Timing Driven Placement, of designing an integrated circuit avoids detailed optimization which consumes enormous computational resources. It organizes physical and logical characteristics of the design so that those characteristics can be optimized with respect to the physical design of the circuit. The characteristics are optimized and the resulting circuit to location assignment is placed and wired with a conventional automated process. The method optimizes the global placement into precincts of logic segments of the circuit design with respect to the segment placement effect on circuit timing and wireability. The method then migrates individual circuits within particular segments to other segments to improve both the individual segment and overall circuit timing and wireability. Finally, the method transfers circuit assignment to logic segment and logic segment assignment to physical location information to a conventional process for final detailed circuit placement and wiring.

24 Claims, 13 Drawing Sheets

OTHER PUBLICATIONS

Kernighan et al., An Efficient Heuristic Procedure for Partitioning Graphs, Bell System Technical Journal, vol. 49, No. 2, 1970, pp. 291–307.

Kirkpatrick et al., Optimization by Simulated Annealing, Science, vol. 220, No. 4598, 13 May 1983, pp. 671–680.

Wolff, Sr., et al., Power/Timing: Optimization and Layout Techniques for LSI Chips Journal of Design Automation & Fault Tolerant Computing, 1978, pp. 145–164.

Cheng, et al., Timing Analysis Model with Micro Block, IBM Technical Disclosure Bulletin, vol. 25, No. 6, Nov. 1982, pp. 2819–2820 [Timing Analysis Model].

Cheng et al., Representation of Source/Sink Delays by a Generated Block, IBM Technical Disclosure Bulletin, No. 6, vol. 25, Nov. 1982, pp. 2821–2825.

Cheng et al., Handling of N-Cycle Paths and Race Conditions in Timing Analysis, IBM Technical Disclosure Bulletin, vol. 25, No. 6, Nov. 1982, pp. 2823–2825.

Cheng et al., Use of "Slack", As a Measurement of Being on Time and the Procedure for Calculating Slack, IBM Technical Disclosure Bulletin, vol. 25, No. 6, Nov. 1982, pp. 2826–2830.

Cheng et al., Modeling of Storage Elements in Terms of the Timing of their Component Parts, IBM Technical Disclosure Bulletin, vol. 25, No. 6, Nov. 1982, pp. 2831–2834.

Cheng et al., Interface Between Timing Analysis Runs for Automatic Transfer of Timing Information, IBM Technical Disclosure Bulletin, vol. 25, No. 6, Nov. 1982, p. 2835.

Hitchcock et al., Block-Oriented Forward Trace Through Blocks for Which the Turn-On and Turn-Off Delays Are Not Equal, IBM Technical Disclosure Bulletin, vol. 25, No. 6, Nov. 1982, pp. 2836–2839.

Auch et al., Incremental Model Development for Timing Analysis, IBM Technical Disclosure Bulletin, vol. 26, No. 10A, Mar. 1984, pp. 5086–5090.

Donath, Interactive Timing Analysis, vol. 23, No. 8, Jan. 1981, p. 3924.

SLACK = 15 - (13 + $\alpha_1$)

$\alpha_1$ IS A FUNCTION OF GLOBAL NET LENGTH, AND HENCE GLOBAL PLACEMENT.

TIMING DRIVEN PLACEMENT

FIELD OF THE INVENTION

This invention relates generally to the field of computer system management. More particularly, it relates to the computer aided design of integrated circuitry and the automated physical layout of integrated circuitry.

BACKGROUND OF THE INVENTION

The development of electronic manufacturing technology has created the ability to build thousands of circuits on a single chip. In order to take advantage of this technology, thousands of circuits must by physically placed and connected on the chip. This can be a very time consuming process, especially when the actual process of designing, placing, and connecting the circuits on the chip can affect the performance and timing requirements of the chip. Therefore, it has become necessary to automate the design process by using a computer to quickly place and wire predesigned circuits into a functional chip.

The basic problem with this automation technique is that it sacrifices the performance of the resulting circuit for the ability to get a connected circuit in a reasonable amount of computing time. When the functional chip being designed is a central processing unit of a computer or other chip in which performance is critical and design complexity high, the performance sacrificed is not acceptable and the automation technique is not useful. This performance sacrifice usually manifests itself in the inability to obtain timing closure in complicated logic. Timing closure is the difference between the time allowed for processing information on the chip as logically designed, and the time required for processing information on the chip as physically designed. Timing closure is not met when the chip as physically wired and placed is not as fast as required by the logical design.

The sacrifice in performance from the prior art automated placement and wire techniques is in two main areas. First, the prior art techniques are mainly concerned with the length of individual wires connecting the individual circuits. It is true that minimizing length helps alleviate performance difficulties, however, the size of the individual drivers driving the lines is also a critical performance factor that is not accounted for by these techniques. Additionally, not all wire lengths need to be minimized. Selectivity in which wire lengths to minimize is critical to completing the overall design. Second, prior art techniques analyze physical placement effects on timing by computing those effects from a detailed timing model. This analysis requires significant computing time which limits the use of the timing model for all circuit placement changes.

Some solutions to the above problems include sensitizing the wiring program to critical logical nets. Critical nets are those circuits within the chip which have relatively more impact on the overall chip performance than do other nets. The sensitization of the wiring program would identify those nets and wire them near the beginning of the program so that they would avoid having to deal with later chip wire congestion and therefore have a greater chance to be as short as possible. This type of sensitization would also include a minimization of the number of maximum crossings of a reference line. The number of crossings would indicate how many bends in the wire which impede circuit performance, therefore, minimizing the number of bends would enhance the chip performance. Although this technique improves performance, it does not address the physical placement of the circuits which created the critical nets.

An alternative approach would be to do a complete timing analysis of the chip after the physical design and identify the critical areas where the physical design added significant delay to critical logical nets. When these areas are found, individual circuits can be rearranged so as to minimize the performance impact. The problem with this is that when the number of circuits gets large or the wiring channels get densely populated the individual changes are difficult and time consuming to make. Also, the number of changes to be made must be limited to reduce the complexity of individual changes and their impact on the design. These difficulties make this design alternative limited because the chips requiring automation typically have large numbers of circuits.

A further alternative design automation approach involves automatically swapping the position of circuits within a chip after it has been wired and recalculating the timing parameters. This procedure leads to inordinate computation time because it is typical to find many paths being affected by an interchange in only two circuits. Therefore, the position swapping is limited in some manner to only those critical paths, physical and logical, which are judged to involve the greatest impact on the circuit. This limitation on which circuits to interchange, limits the effectiveness of the automation procedure. This is because many physical positions of circuits are never evaluated and so the judgment of which circuits to interchange does not take those possibilities into account.

A still further alternative design automation approach involves placing an upper bound on the maximum length of a wire within all the nets of the chip design. While automated wire placement is difficult, it is not more difficult to use an upper bound than it is to minimize the wire lengths. This approach evaluates slack as a means to prioritize which nets require special attention by the wiring program. Slack is the difference between the designed (logical) delay and the actual delay (after added wiring delay) from the wiring program. If slack is positive, the net meets the design criteria and does not get additional program attention. If the slack is negative, the net is re-routed until the net slack becomes positive. Again, as in other techniques, this program does not account for the placement of the circuits which are to be wired. Therefore, many placement solutions are never considered and so the wiring or performance is not likely to be optimal.

OBJECTS OF THE INVENTION

It is the object of this invention to enhance the automated circuit design process.

It is a further object of this invention to enhance the automated circuit design process by optimizing the position of the circuits within the design.

It is another object of this invention to enhance the automated circuit design process by optimizing circuit placement and connection concurrently.

It is still a further object of this invention to enhance the automated circuit design process by optimizing circuit placement and connection concurrently with respect to the timing effect the circuit placement and connection has on the logic operation.

It is still another object of this invention to enhance the automated circuit design process by optimizing circuit and connection placement while minimizing the calculations required for the process.

SUMMARY OF THE INVENTION

The invention is a method of designing an integrated circuit in which the steps of designing the circuit are optimized by a formal hierarchy. This method, called Timing Driven Placement, of designing an integrated circuit avoids detailed optimization which consumes enormous computational resources. It organizes physical and logical characteristics of the design so that those characteristics can be optimized with respect to the physical design of the circuit. The characteristics are optimized and the resulting circuit to location assignment is placed and wired with a conventional automated process. The method optimizes the global placement into precincts of logic segments of the circuit design with respect to the segment placement effect on circuit timing and wireability. The method then migrates individual circuits within particular segments to other segments to improve both the individual segment and overall circuit timing and wireability. Finally, the method transfers circuit assignment to logic segment and logic segment assignment to physical location information to a conventional process for final detailed circuit placement and wiring.

The timing driven placement method begins with a logical and physical description of the overall circuit design. This includes logical block interconnections as well as available space within which to design the circuits. This description is then partitioned into smaller logical segments and physical precincts with the size of the precinct roughly determined by the space required for the logical segment. Circuit interconnections that span two (or more) precincts for a single circuit are called global nets. Minimizing the number of global nets improves both the wiring and the timing because fewer global nets results in fewer added delays between circuits and fewer wiring channels which are required to connect the circuits. The individual segments are initially assigned to the precincts in a random fashion. This allows an initial cost for the optimization of the design to be set by estimating the wiring complexity required to connect the randomly placed segments into an operating circuit. Cost is a measure of the overall optimization of the design and reflects both wiring complexity and the effect of the wiring on the timing of the logic.

The segments are then interchanged between precincts and a new cost is measured for the new overall segment placement. If the new segment placement has a lower cost or if the move is probably a good one to accept even if the cost is higher, the new segment placement is accepted. If the cost is higher and the move is probably not a good one to accept, the segments are left in their original precincts. Segment interchanges between precincts are evaluated until cost for the segment placement is optimized. The cost evaluation provides for a dynamic evaluation of both wiring and logic timing as a function of segment placement without using large computational resources. This significantly reduces re-design problems resulting from wiring optimization having an adverse effect on the logic timing.

Once the segment placement has been optimized, individual circuits within a precinct may violate the logic circuit timing requirements even though the overall segment placement is optimized. The present design method corrects these circuit problems by interchanging individual circuits between precincts while dynamically evaluating the effect of the wiring change on the circuit timing and the wiring complexity of the logic design. This interchange of circuits between precincts is called circuit migration and is a design trade-off between circuit performance and wireability. The circuit migration will create a different set of global nets. However, the individual global nets will reduce critical timing or wiring problems.

PREFERRED EMBODIMENT

Figure 1:
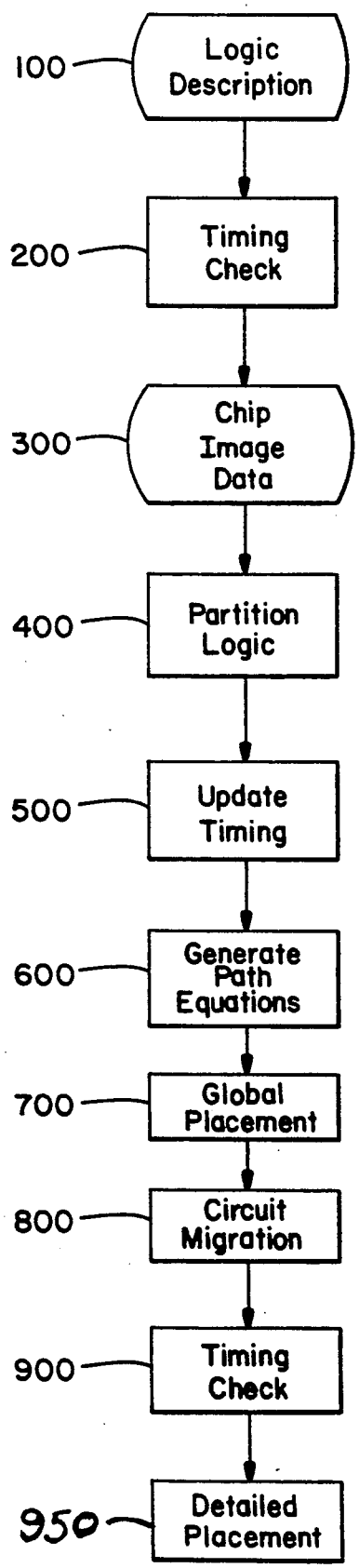
FIG. 1 illustrates a preferred embodiment of the Timing Driven Placement Process of the present invention.

A preferred embodiment of the present invention is illustrated in FIG. 1. FIG. 1 generally illustrates the basic flow of the automated circuit design process referred to as the Timing Driven Placement Process. The process starts by generating some description of the logic of the circuit design. The logic description 100 of the circuit design is the basic element on which the present invention operates. The logic description must include the function required of each element of logic (called blocks), the inputs required for each element, the outputs required for each element, and a delay in propagation of the inputs to the outputs of each element. These elements establish the design starting point because they describe the basic logical interrelationship, the interconnections between logical elements (called nets), as well as the timing relationship between elements.

The logic description 100 has an initial timing check 200 performed on it. This is a rough verification that the initial timing parameters setting up the logic operation (such as clocks, inputs, etc.) are properly connected in the description. The timing check also verifies that there are no feedback loops in the logic design. The timing check is an evaluation of the delay between capture points (or between a primary input and a capture point) along a particular path. In this evaluation, a path is a composition of nets connecting one capture point to another. Also, a capture point is a latch or a primary output. Timing is measured by slack. Slack is the difference between the arrival time of a signal delayed through a latch bounded circuit and the design required arrival time at a capture point. As long as the designed value is larger than the arrival time, i.e. slack is positive, the logic timing is correct.

Following the initial timing check 200, the chip image data 300 is generated. The chip image data 300 describes the outline of the chip within which the logic is to be placed. The outline provides a basic coordinate set on which to base the placement of circuits. The outline of the chip is divided up into approximately equal area rectangles called precincts. Each precinct will contain a segment of the logic design and the rectangle size is based on the effect of net delay between blocks in different precincts.

The next step is to partition the logic 400 into segments where the number of segments equals the number of precincts. This step repeatedly bi-partitions the logic into smaller subsets. This partitioning is performed on a connectivity basis such that there are a minimum number of nets which span across subsets. The purpose of this step is to reduce the complexity of placing logical groups into an area within the chip outline.

The timing analysis 500 can now be updated because more information about the characteristics of the nets is known. The new information is whether the net is local (within a segment) or global, the number of connections for the net, and how many segments there are (an indication of the length of the net). This facilitates making a better capacitance estimation for each net. This capacitance estimation enables a calculation of the nominal delay for each net. This nominal delay is used in two ways. First, circuit moves from segment to segment are tested to reduced delays of nets (identified by the nominal delay). Second, the nominal delay is a basis from which to evaluate changes to the overall placement of segments within precincts, called global placement.

Based on the assignment of circuits to segments, a representation, called path equations 600, of the path delays is generated. This representation assumes a nominal capacitance for each net based on the calculation of estimated capacitance used for the timing analysis update. As segment placement changes, delay on the net changes because the capacitance and resistance between segments change. Path equations are the means to evaluate the overall design timing changes without performing a detailed timing analysis for all the nets in the design.

Slack is optimized by interchanging different segments into different precincts and evaluating the path equations to determine whether or not an improvement in the slack has been realized. The evaluation of whether an improvement in slack has been realized is done by a modified simulated annealing process called Global Placement 700. Simulated annealing is a statistical process for ordering random objects. Global Placement 700 applies this theory to the segment placement problem by developing a cost function which depends upon slack and wiring considerations for a current state of the segment placement within the precincts. Global placement 700 then forms a test state by moving segments to different precincts from the segments' current precinct placement. A cost value from the test state is compared to the cost value of the current state. If the test state has an acceptable (generally lower) cost compared to the current state, then the test state becomes the new current state. Otherwise the current state remains as the current state.

This adaptation of a simulated annealing process is controlled by a parameter called temperature. A number of segment moves between precincts is attempted at each temperature. These moves are evaluated with respect to cost, the temperature is lowered, and another set of moves is attempted and evaluated. This process is repeated until the change in cost at a particular temperature becomes very small. This means that few moves are found to be acceptable. The design is near optimal at this point and as such, the segments have been assigned to their near optimum precincts.

After the segments have been placed in precincts, individual paths will have negative slacks even though the segment placement is near optimal for the chip in the aggregate. Additionally, there will be some precincts without available wiring channel capacity to handle the segments as placed. These problems are addressed by the circuit migration process 800. Circuit migration is a combination of a circuit timing step 801 and a circuit move step 850. The circuit timing step 801 moves circuits between precincts in order to reduce the slack of some of the individual paths. The circuit move step 850 moves circuits from one precinct to another in order to optimize the wireability part of the cost function used in the global placement 700 process.

Once both the optimization of global placement 700 and both circuit timing and circuit move steps, 801 and 850 are complete, the placement and wiring of the circuits within the chip has been specified. A final timing analysis of the logic design is then made 900. The overall placement of the circuits into precincts and the location of the precincts is now final. This assignment of circuits to precincts is now passed to a detailed placement process 950. The detailed placement process is a standard logic design process in which the overall placement of circuits and precinct location has been specified by the Timing Driven Placement Process. The final physical design will be completed faster and will require fewer redesigns for timing and wiring problems as a result of using the Timing Driven Process System.

Figure 2:
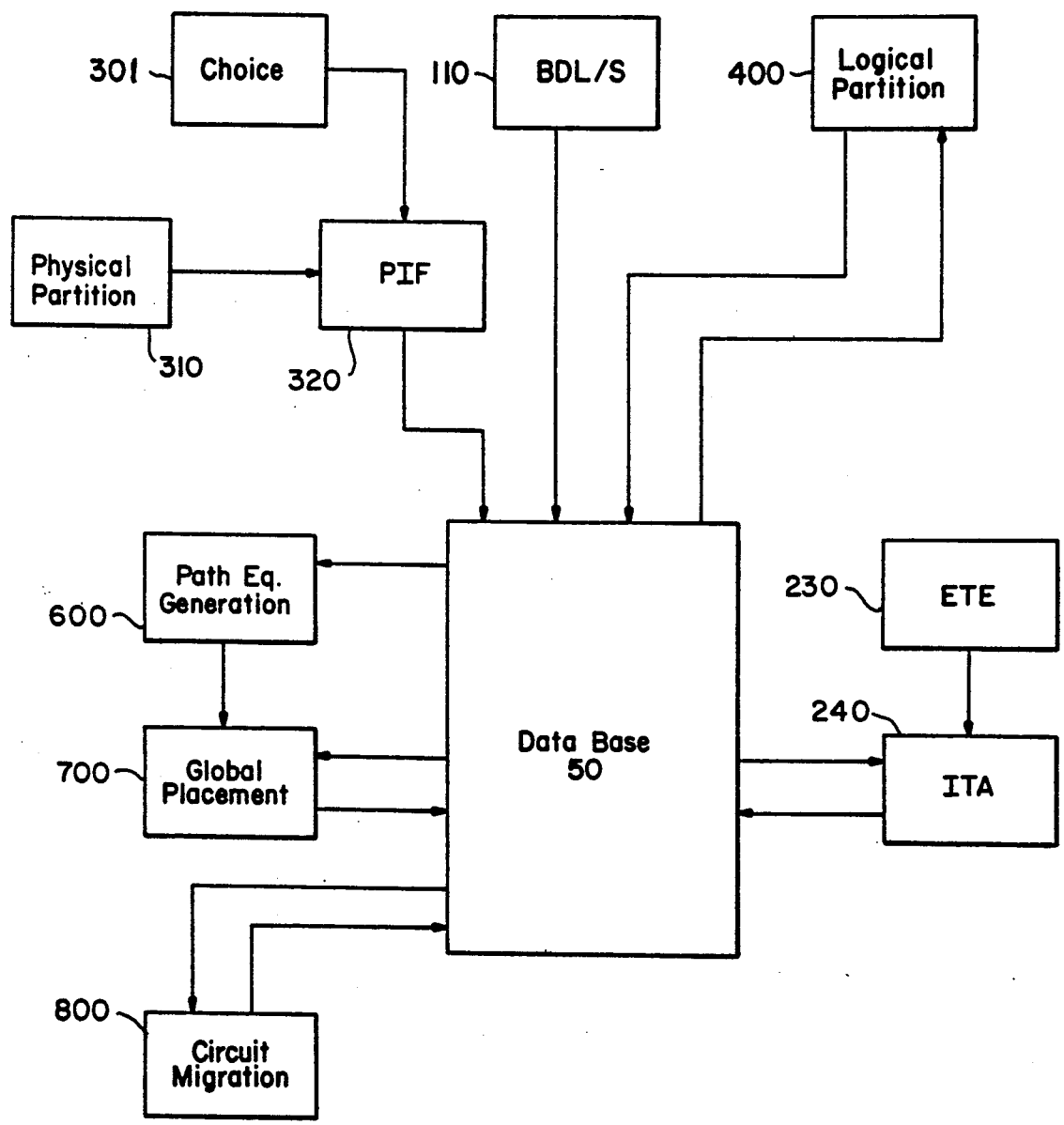
FIG. 2 illustrates the Timing Driven Placement System and the relationship between the database and processes which operate on the database.

A more detailed explanation of the operation of each of the above elements of the Timing Driven Placement system follows with reference to FIG. 2. FIG. 2 is a diagram of the relationship between various computer processes and raw data which comprise the Timing Driven Placement System which implements the Timing Driven Placement Process. The initial starting point of the chip design process is the logical description of the functional chip. This is described in a format called Basic Design Language for Structure (BDL/S) 110. BDL/S is a free format high level computer language for describing the physical and logical characteristics of logic designs. The language is easily written by those of skill in the art having familiarity with a computer system on which they are working.

The broad function of the language as used in the timing driven placement system is that it describes the interconnections of logic blocks for the logic design. Specifically, BDL/S describes a data array which is put into the database 50. The data array contains a block rule name, a physical rule name, input and output pin names, and a netname for each net attached to each pin. This information is supplied for each logical block of the logic design. Once this data is input into the database 50, linked lists from the database 50 can be created for blocks, nets, and pins so that a) for each block, the first pin on the block can be identified, b) for each net, the first pin on the net can be identified, c) for each pin, the net it is on can be identified, the next pin on the block can be identified, and the next pin on the net can be identified. Additionally, as more information is generated about connections between pins from the timing driven placement process, it can be added to the database 50 by pin identification.

After the logic is specified, a timing check 200 of the basic logic design is performed using Incremental Timing Analysis (ITA) 240 with input from the Early Timing Estimator (ETE) files 230. ITA 240 is a timing analysis process which analyzes either part of or all of logic design with various accuracy levels of capacitance and resistance estimates. ITA 240 takes the logic description in database 50 and the input from TE 230 and creates a timing model of the logic. The analysis is based on the interconnections (nets) between logic blocks and an initial capacitance estimation from the number of pins on the nets (essentially this is the fanout of the driving logic blocks). The initial capacitance is a uniform capacitance per pin times the number of pins on a net.

The ETE 230 files contain information specifying, for each block, the delay from each input pin to each output pin as a function of the output pin load capacitance. ETE 230 contains information specifying the set up and hold times for data pins relative to clock pins for each Shift Register Latch (SRL) block type. Additionally, ETE 230 contains user definable primary input signal arrival times and primary output signal arrival times. Finally, ETE 230 contains a list of nets to be excluded from analysis (if any), whether the SRLs are in flush mode or normal operation, and any clock adjusts or data path timing adjusts the user may desire.

Figure 3A:
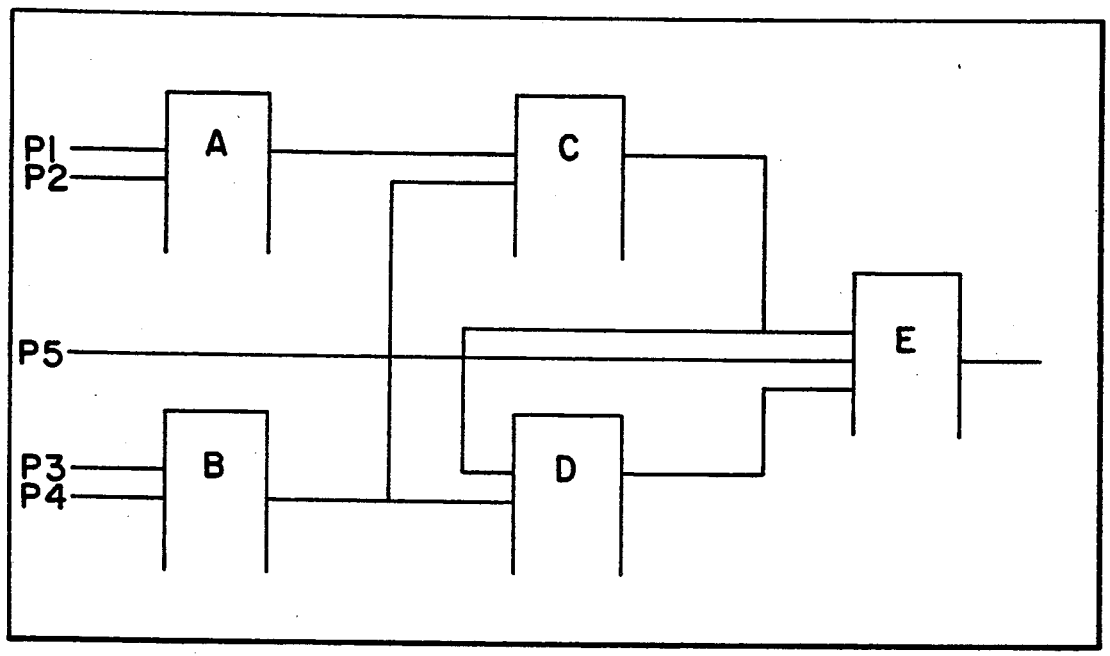
FIGS. 3a and 3b illustrate the logic block levelization technique.
Figure 3B:
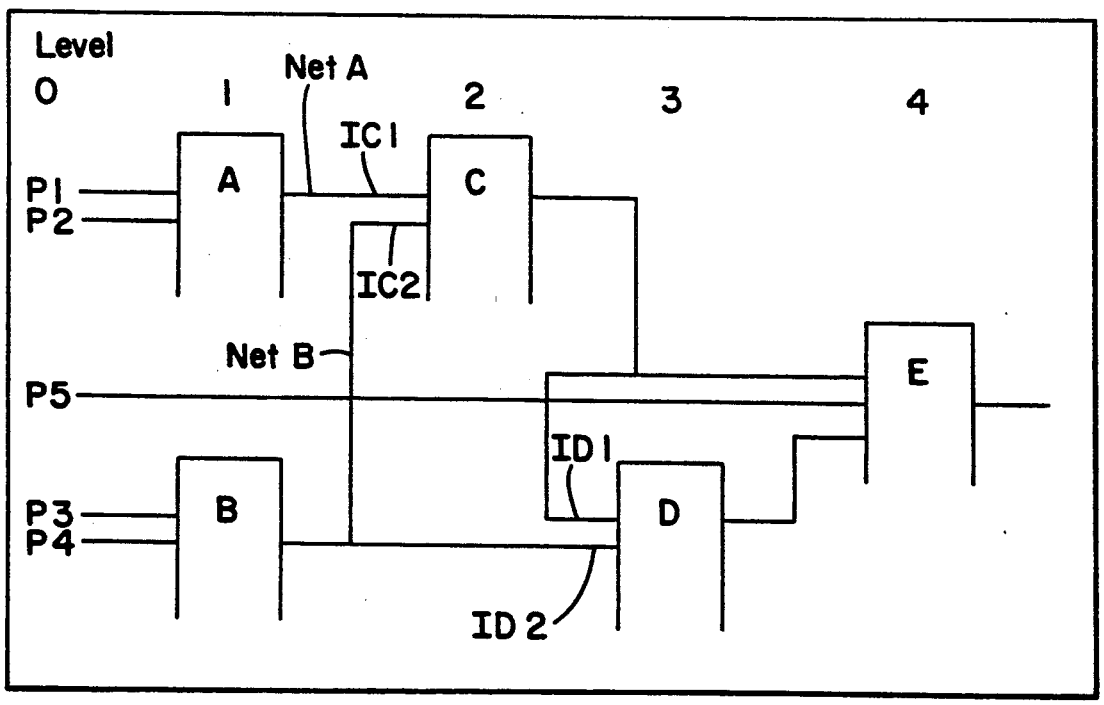

ITA 240 works on the premise that all logic paths must meet some timing constraint, that is, all data signals must arrive at a particular logic at a particular time to assure a proper result. This means that in order to get a logic block output, all previous input arrival times must have already been determined. The output of that block will be the block delay added to the worst case arrival time. This process is illustrated in FIG. 3. Primary inputs and latches are assigned level "0", and any block whose inputs are only at level "0" is assigned a level "1". In FIG. 3, P1-P4 would be at level 0, while logic block A and B would be at level 1. More generally, any logic block has a level (e) if none of its inputs has a level greater than (e-1) and at least one of its inputs has a level (e-1).

ITA 240 determines the arrival time of the inputs to block C as the worst case arrival time between IC1 and IC2. The arrival time of IC1 is determined by adding the delay of block A to the latest arrival of primary input P1 or P2, and then adding the capacitance delay from net A. The capacitance of net A is merely estimated originally as the fanout times the capacitance per fanout (fanout is the number of receiving pins) of the block A output. This estimate is used t this time because no other information about the net is known. When more information about the nets are known the capacitance estimate can be updated and the analysis rerun to provide a more accurate timing model.

The arrival time of IC2 is the delay of block B added to the latest arrival of P3 or P4, to which is added the net B capacitance delay. Here, the net B capacitance delay is two time the fanout capacitance because the output is driving two pins. ITA 240 calculates all the arrival times of the input signals for each block and stores the results in the database 50. The difference between the calculated and designed arrival times on a net between capture points is the slack of the net. When the slack is negative, the design has a timing problem. ITA 240 calculates the net slacks based on the arrival times of the input signals to each block. When capacitance estimates are updated the net slacks will also be updated and stored in database 50.

In order to accomplish the optimization, the final design must be physically placed on a chip, and therefore some description of that chip and the physical rules of the technology must be specified. Choice 301 is a compilation of data which specifies the basis groundrules and outline of the designed chip. Choice 301 contains the coordinates within which the chip will be designed so that the optimization programs will have a point of reference. Choice 301 also contains the size of each physical rule name in terms of an equivalent number of cells, and the capacitance per unit length of wiring in the x and y wiring planes. Physical Partitioning 310 is a process of dividing the outline of the chip into smaller areas. Physical Partitioning 310 creates a Physical Interface File (PIF) 320 which contains precinct information such as the number of horizontal wiring tracks per precinct (Ht), the number of vertical wiring tracks (Vt), the coordinates of the precinct edges, a row and column index for the precincts, with a number of cell rows and cell columns.

The wiring channels can be part of the physical description because even though segments will be interchanged between precincts, the wiring channels for each precinct will remain constant. The number of wiring channels for each precinct depends on the size of the precincts. The size of the precincts are determined in the physical partitioning 310. Here the chip is merely broken up into approximately equal area rectangles. The timing driven placement process estimates net length between precincts (global nets) as the Manhattan distance between precincts, assuming that global nets travel precinct center to precinct center. The size of the rectangles is chosen to be small enough so that the average error of path length and its corresponding effects on delay are not significant compared to the actual path length. For example, if a chip design is for an area of 9.4 square millimeters, there are 120 precincts.

Approximate precinct size determines how may logic blocks are placed into a precinct. Each logic block in the database 50 is described in terms of an equivalent number of cells. A cell being the fundamental unit for describing the physical size of the circuits in the logic design. For example a NAND gate might take up 5 cells and a NOR gate might take up 3 cells. The size of the precinct determines how many equivalent cells fit into the precinct. On the 9.4 square millimeter chip having 120 precincts, there are 252 cells per precinct.

Figure 4A:
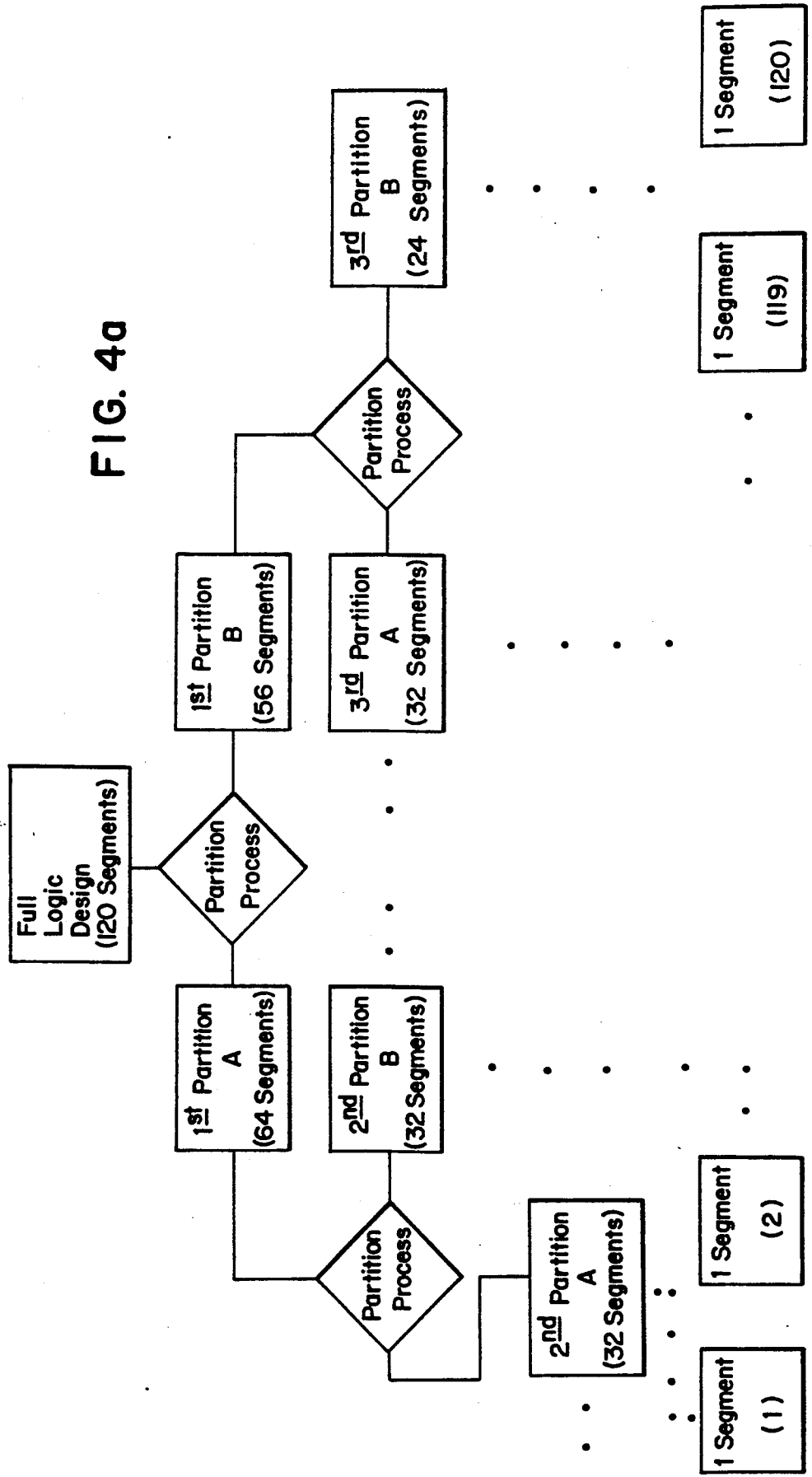
FIGS. 4a-4c illustrate the logical partition process.
Figure 4B:
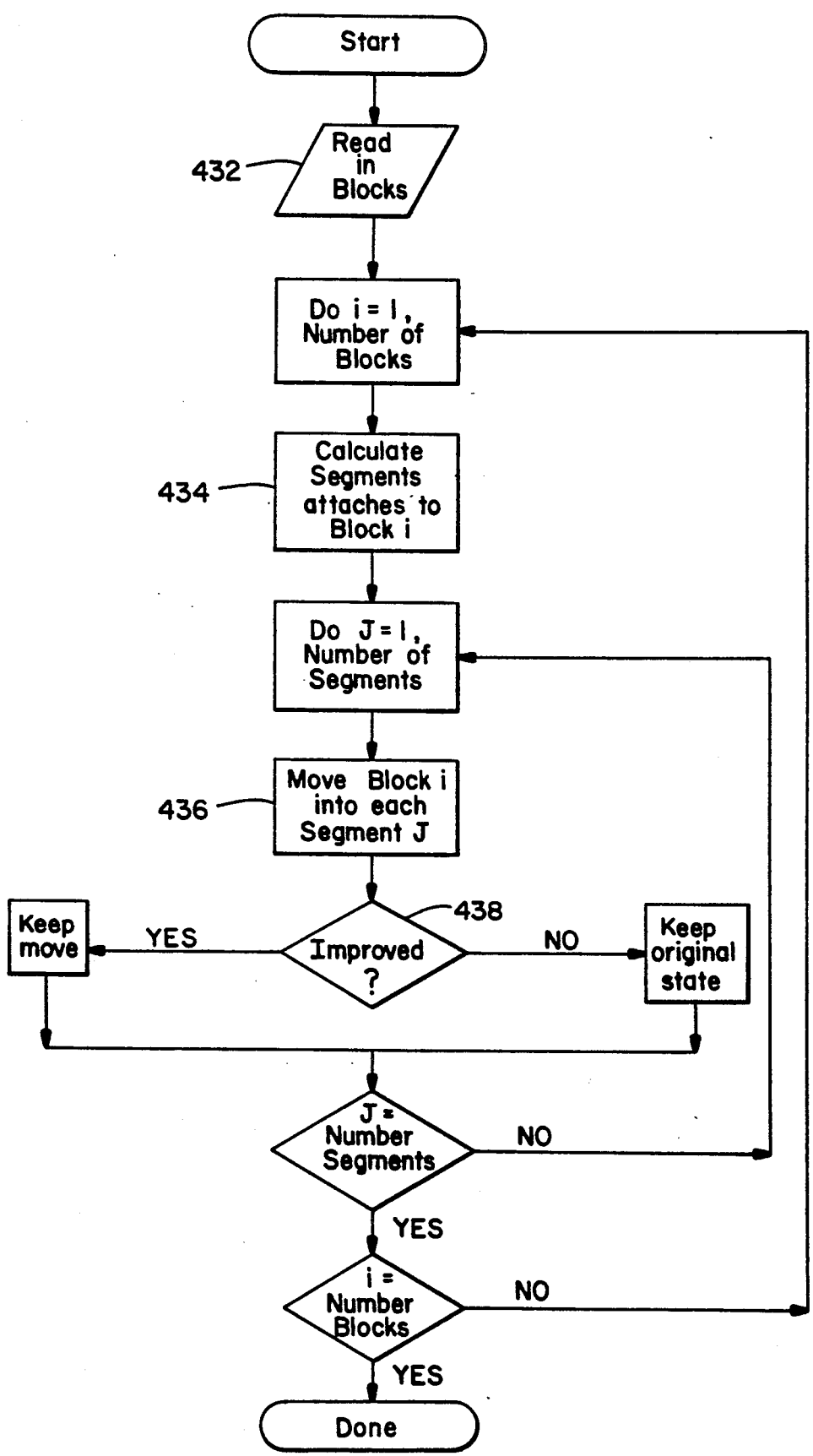
Figure 4C:
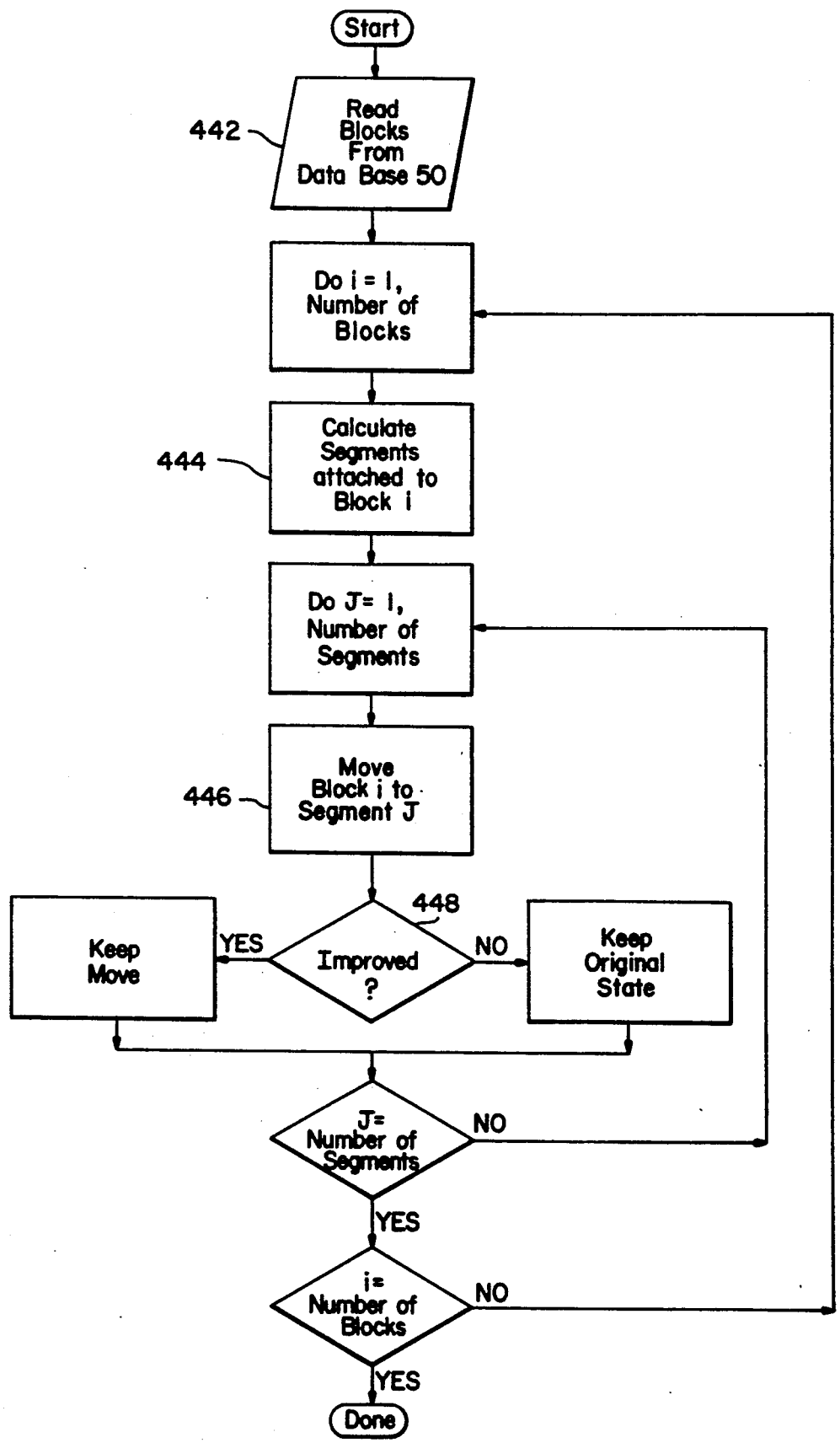

Once the number and approximate area of the precincts has been determined, a rough partition of the logic 400 must be accomplished so that each segment of the partitioned logic can be assigned to a single physical precinct and each segment has the maximum freedom to be interchanged between precincts. FIGS. 4a, 4b, and 4c illustrate this process. FIG. 4a illustrates how the logic blocks of the total design are repeatedly subdivided into subsets so as to obtain segments of logic (120 for this embodiment) at the end of the process. At each partition process, a parent subset into a subset A and subset B. The size of subset A is made equal to the value of 2n ( denoted raising a value to the nth power) and the size of subset B is made equal to the size of the parent minus the size of subset A, such that their sizes are as close as possible to being equal. For example, when the parent is to be divided into 120 segments, 2**6=64, and 120−64=56, so that subset A in the first process has 64 segments worth of logic and subset B has size of 56. This process is repeated until all subsets have size equal to 1, this is the segment size.

The partition process starts by obtaining all the logic blocks of the parent from database 50. The total cell size of the parent is obtained by summing the cell size of each block over all the blocks contained in the parent. The nominal cell size of each subset is determined by taking the ratio of the size of the subset to the parent and multiplying this by the total cell size of the parent. For example, if the total cell size is 20,000 equivalent cells, subset A would have $(64/120) \times 20,000$ as an equivalent cell size. When the cell size of the subset is known, blocks of the parent are assigned to subset A until the equivalent cell size of the subset is reached, then the rest of the blocks of the parent are placed in the remaining subset.

The number of nets that have attached blocks in both subset A and subset B is called the cut set. A gain vector can be calculated for each block in the set of blocks attached to the cut set. This gain vector is the measure for determining the effect of moving a block from subset A to subset B or vice versa. Using gain vectors, blocks are moved from subset to subset to achieve a partition that is near optimal in the minimization of the cut size. The algorithm for minimizing the cut size follows that described in "An Improved Min-Cut Algorithm for Partitioning VLSI Networks", by Balakrishnan Krishnamurthy, IEEE Transactions On Computers, volume c-33, No. 5, May 1984, pages 438–446, which is hereby incorporated by reference into this application. However, this algorithm is modified in that nets are divided into two categories. One category for global nets (nets which have been previously cut) and local (previously uncut). Gain vectors and cut sets are maintained for both categories. A higher weight is assigned to cutting a previously uncut net than is assigned to one that is already global.

Once the logic design has gone through the logic partition process 400, each block has been assigned a segment. The processes illustrated in FIG. 4b and 4c further optimize the assignment of blocks to segments. The Pass One Optimization 430 attempts to minimizes the number of global nets without making local nets become global nets. The database 50 is read 432 for the interconnection and segment assignment information of all the logic blocks in the design. Each block, Bi, has pins connected to it, and for each pin there are other blocks, Bj, attached to the pin. This allows the development of a linked chain 434 showing which other blocks, Bj, are attached to each block, Bi. Each block, Bi, is then moved 436 into a segment of block Bj which is different than the segment containing block Bi. When the move results in fewer global nets without making local nets into global nets, the move is kept 438. When the move does not, then the next move is tried. All the moves for a block are exhausted and then the process moves on to the next block until all the blocks have been tried.

The Pass Two Optimization 440 is shown in FIG. 4c and operates very similarly to the Pass One Optimization 430 except that the optimization calculation focuses not on global nets, but on Rent's coefficient. The Rent relationship is $T = (A \times C)^{**}p$ where T is the average number of terminals required by a group containing an average of C blocks and A is the average number of terminals per block. The exponent (p) changes depending on the nature of the circuitry. This means that if the circuitry is highly parallel, the constant is higher, if the circuitry is highly serial, the constant is lower. The group of blocks used here is a segment and each time a block is moved to a new segment, the coefficient (p) is recalculated for both the segments (the from and to segments). When the average of the two coefficients decrease this means that the wireability of the segments will be easier to achieve. The database 50 is read 442 for the interconnection and segment assignment information of all the logic blocks in the design. The segments attached to each block are calculated 444. Each block is moved 446 into each segment that is attached to the block. The average Rent's coefficient (p) is calculated 448 for the two segments and if there is an improvement (decrease) the move is kept. If there is not an improvement, which should be the majority of the time, the original placement of the blocks in the segments is kept. This procedure is repeated for all the blocks in the logic design.

The result of the partitioning process and the two pass optimization process is an assignment of blocks to segments. This allows maximum freedom to place the segments into precincts later in the Timing Driven Placement System. This placement allows an update 500 of the timing analysis of the logic design taking into consideration the fanout of circuits within the segment placement and an associated estimated capacitance for global nets. This is an added delay that has not yet been taken into account in the ITA 240 analysis, which to this time, has been only based on the fanout.

Figure 5:
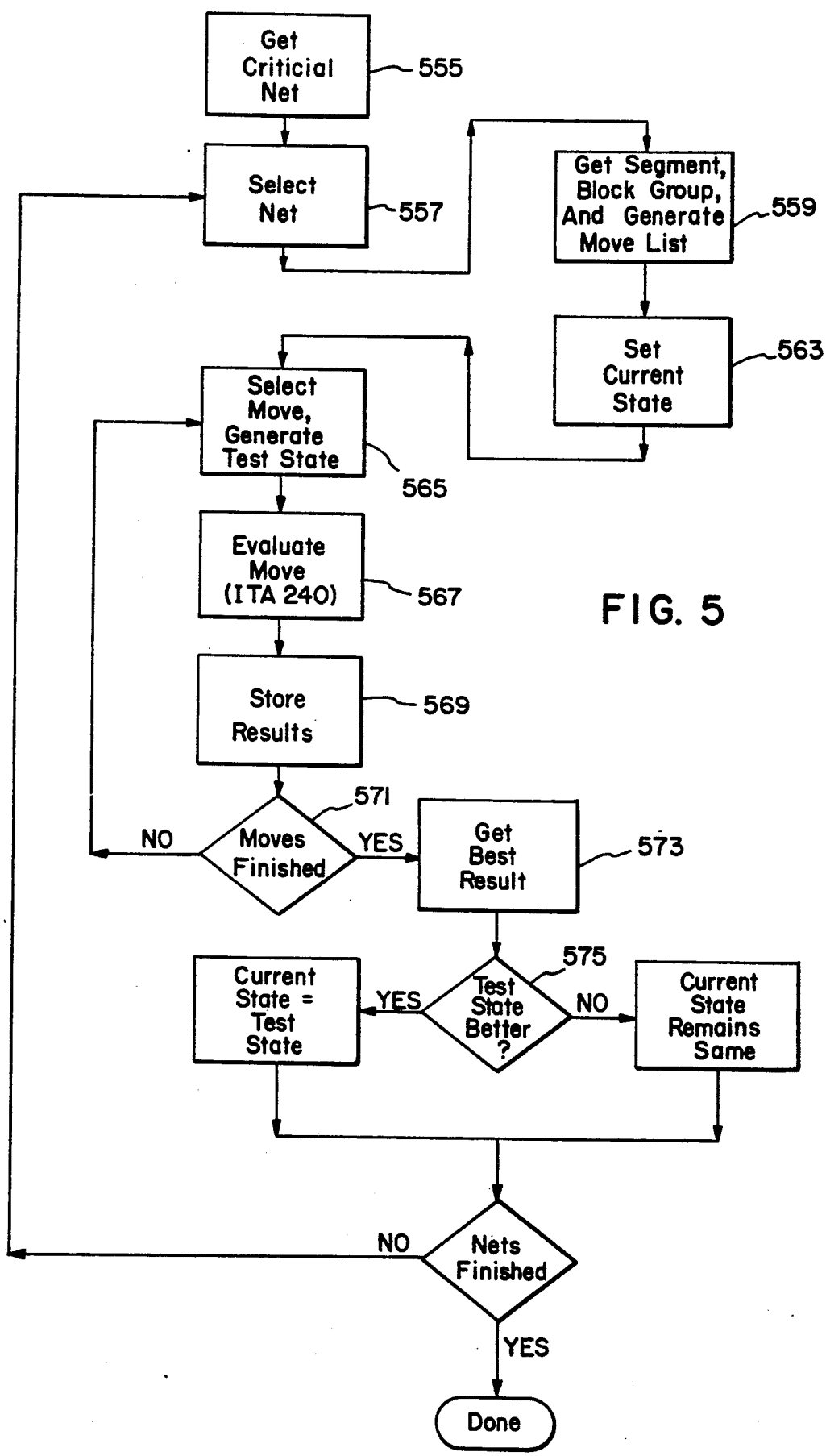
FIG. 5 illustrates the segment improvement process.

The timing update 500 will indicate a number of nets which have critical slack. Critical slack is a slack less than some baseslack defined by the user (usually 0). Assignment of blocks between segments is used at this time to alleviate the critical slack problem through the Segment Improvement process 550 illustrated in FIG. 5. First, a list of critical nets is created 555 from the timing analysis update 500. Each net is treated separately 557. Each net attaches to a group of blocks in different segments. All the blocks on a net are listed along with the segments, and blocks which are in one segment form a group 559. A move list is then generated from the segment list and block group list. The move list contains the possible movement of a group into other segments from the segment list (for example, if there are three groups from segments A, B, and C, the possible moves would be A into B and C, B into A and C, A and B into C, B and C into A, etc.).

The segment improvement process 550 saves the current state of the block assignment to segment 563. The process then selects one of the moves from the move list, and forms a postulated test state 565 by making the selected move from the move list. This creates a change in the slack on that net which is evaluated 567 by ITA 240. ITA 240 only evaluates the timing of the blocks which have inputs or outputs changed. Each level of the logic design in ITA 240 is assigned a forward and a backward queue of circuits which are to be evaluated for delay. The forward queue only contains the circuits which have changed inputs. The backward queue only contains circuits in which the outputs have arrival times that have changed. Whether a circuit has a changed input or output can be determined from the levelized logic block interconnection data already in the database 50. The updated global net capacitance estimate is used to calculate a new delay between segments. This in turn, allows a new calculation of arrival times of the outputs of the changed logic blocks. The new arrival times for the outputs specifies a new slack value for all the changed paths. This mode of analysis makes the timing analysis more computationally efficient.

The worst case slack associated with the move from the move list is stored 569. This process is repeated for all the moves in the move list 571. When all the moves have been completed, the best timing result from the stored moves is selected 573. If this result is better than the current state 575, then the move associated with the best timing results is made and the current state becomes the test state. If the result is not better than the current state, then the current state remains as it is. This process is then repeated for all the critical nets.

Once circuits are assigned to segments and evaluated through the Segment Improvement Process 550, the Path Equation Generation process 600 is performed. Path equations are a means to characterize the timing of the logic design as a function of the segment to precinct assignment. This process is required because the timing driven placement system makes many moves of segments to different precincts to optimize the global placement. The effect of these moves on timing must be calculated by some means other than a detailed timing analysis after each move because such an analysis would be prohibitive in terms of execution time.

There are basically four steps involved in the Equation Generation Process 600. First, the timing analysis of the logic design is updated (similar to the update in step 500) with the capacitance of the nets estimated on the basis not only of the fanout but also on whether the net is local or global. (in the ITA 240 update in step 500, the capacitance estimate did not include a different estimate of local v. global net capacitance). This estimate is the nominal capacitance of the net. Second, the process creates terms which characterize the change in delay of a global net as a function of its actual capacitance relative to its nominal capacitance. The terms are a parametric measurement of the placement of the segments with respect to each other because they are a characterization of that placement as a function of capacitance associated with the net length. Third, the terms are propagated through the logic which is similar to a timing analysis forward propagation step but more complex since the time of arrival calculation involves a nominal time plus a set of terms (this is called an equation) rather than a single number. Each time a global net is encountered an additional term is added to the set of terms in the equation. Fourth, the process creates slack equations at capture points by subtracting the required time of arrival from the actual time of arrival (actual time of arrival is a nominal time plus all the added terms). The equation generation process 600 outputs a file of these final equations (with a nominal slack appended to them), a file of the terms, and a file of the equation forms (capacitance estimates) for later use by the timing driven placement process.

Terms are created in the following manner. First, all global nets that impinge on the same set of segments are grouped together. The global net with the worst case nominal slack is selected. A two piece linear equation (useful for CMOS technology and not computationally expensive) is fitted to the curve that describes the change in delay as a function of the change in capacitance from the nominal delay of the net. The constants a1, b1, and Ccrit (this collection of constants is called the equation form) are generated so that the delay correction (DC) can be determined, as the capacitance changes from the nominal capacitance of the net Cnom, by the following formulas:

$$DC = (a1 \times (C - Ccrit)) - (a1 \times (Cnom - Ccrit));$$

When C (actual capacitance of the net)_Ccrit.

$$DC = (b1 \times (C - Ccrit)) - (b1 \times (Cnom - Ccrit));$$

When C (actual capacitance of the net)_Ccrit.

The term is then defined by the equation form and the list of segments to which the net is attached. The rest of the global nets of the group under consideration are tested to determine how well they fit with this equation form. When the deviation for a net with significant slack becomes too large, another form (different values of a1, b1, and Ccrit) is created. This creates another term. This technique is repeated for all the groups of global nets that have the same segment list until all global nets have been processed.

Delay in nets may be considered to arise from two distance causes, capacitive loading causes a delay even if the connections have no resistance. This form of delay varies with the capacitance of the net. A second form of delay arises from the resistance internal to the interconnections. In this type of delay, it is important where the driving circuit (i.e.. source) is located and how it relates to the driven circuits (i.e.. sinks). Depending on the technology employed in the fabrication of the circuit, this may create more complexity in the term generation. In this embodiment (i.e., for CMOS) it is adequate to know the largest source to sink separation. Therefore, nets with 3 or more segments are grouped by the segment holding the source circuit (for example, if two nets connect segments 1, 5, and 12, and in one net the driver is in segment 1 and in the other net the driver is in segment 5, the two nets would have separate terms).

Figure 6:
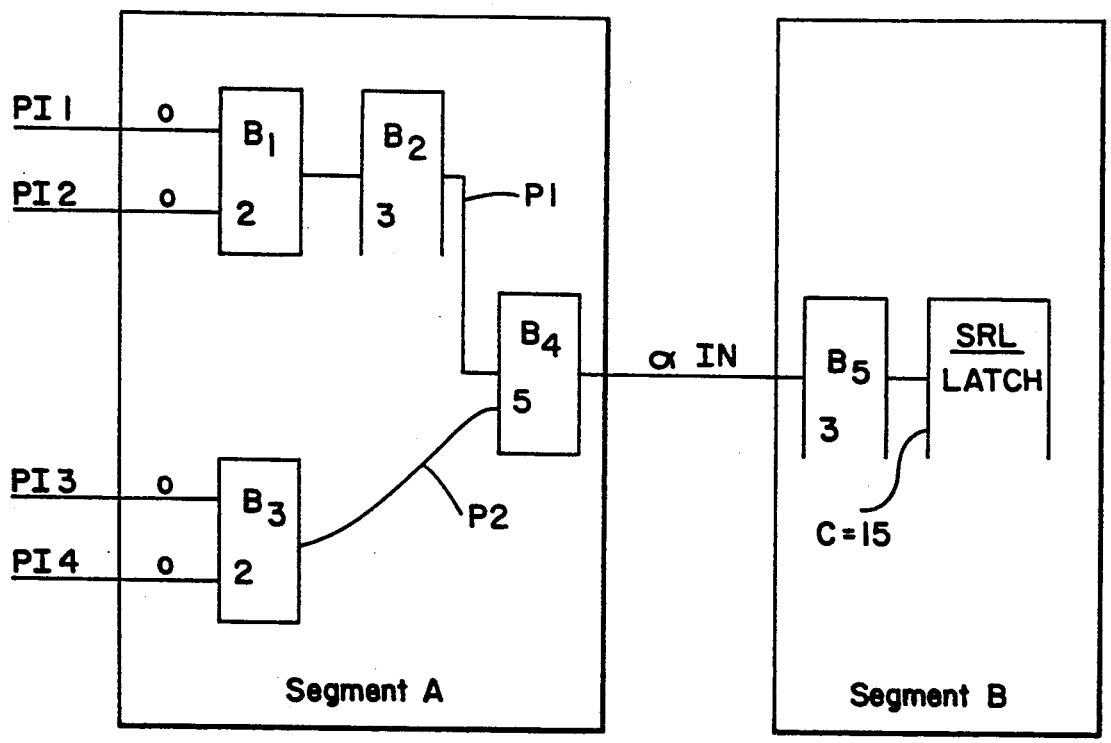
FIG. 6 illustrates the parameters associated with the equation generation process.

FIG. 6 illustrates the generation of slack values. The clock in segment B arrives at time=15 to latch the output of logic block 5. Primary input 1 (PI1) starts at time=0 (level 0), and arrives at the input P1 of block 4 at time=5. The arrival time of this signal is derived from the propagation of PI1 through blocks 1 and 2 having nominal delays of 2 and 3 respectively. Similarly, the arrival time of the signal at the input P2 of block 4 is time=2. The nominal delay of block 4 is 5, so that the signal from the output of block 4 arrives at the input to block 5 at either 2+5+alpha or 5+5+alpha, whichever is later. In this simple case it is obviously 10+alpha, but if the time of arrival at pins P1 and P2 included terms instead of being pure numbers, there is no immediate determination which is later because the terms can only be calculated once the segment placement is known.

The slack in this simple case is the clock arrival time of 15 minus the 10 from the nominal delay of the blocks in segment A minus the 3 from the nominal delay of block 5 in segment B minus the alpha which represents the delay correction of the global net. If the slack is positive then the propagated signal arrives before the clock arrives to latch the signal and the design time is met. If the slack is negative, the clock does not latch the correct data, so the design is incorrect. The slack value for any path cannot be determined until the alpha for each global net is known for all nets in that path.

The Equation Generation process 600 can lead to the generation of many more equations (list of terms and nominal delays) than necessary because of the multiplicity of paths on a chip (path is from the input pin of a block to the input pin of a successor block). This process keeps this number as low as possible by limiting the number of terms generated by only creating new terms when the deviation of the delay on a net is too large for the form, as described earlier. Also the terms are maintained in a sequence, which means that multiple occurrences of the same equations can be identified as such. Therefore, only the worst case path equation is kept when the paths have the same set of terms. Finally, the number of paths handled during any propagation step can be limited (to some number depending on computation capability, here 50 to 300), retaining only those paths with the worst case nominal arrival time.

After the equation generation process 600 is complete, the database 50 interacts with three separate processes, Global Placement 700, Interactive Timing Analysis 240, and Circuit Migration 800. These processes combine to perform two functions. The first function is a global placement optimization of the segments to the precincts. Here, global placement interacts with both the database 50 and the path equations generated in 600 to optimize segment placement into precincts based on wiring and timing considerations. The second function is a migration of circuits between precincts, once the segment position is fixed, based on the timing and wireability of the segments in their global position. This is necessary to fix local wiring and timing problems that the global placement 700 does not address.

The global placement 700 process is an adaptation of the general technique of simulated annealing as applied to circuit placement. The simulated annealing technique is a statistical process used to solve large optimization problems in which random elements in a system are to be ordered according to a given cost function. The segments are initially randomly placed in segments which produces some reference cost. Global placement 700 then posits a test state which is formed by interchanging the segment placement between precincts of the current state. If the test state has an acceptable cost compared to the current state, then the test state (with the interchanged segments) becomes the current state. Otherwise the current state remains as it is without the interchanged segments. This process provides a mechanism to obtain a near optimum cost for the global placement of the segments and therefore a near optimum placement with respect to the parameters comprising the cost function.

The general technique of simulated annealing is well known as illustrated in the article "Optimization by Simulated Annealing", S. Kirkpatrick, C. D. Gelatt Jr., and M. P. Vecchi, in SCIENCE, Volume 220, Number 4598, May 13, 1983, pages 671-680 which is hereby incorporated by reference into this application. Simulated annealing has two specific properties. First, it demonstrates that there are several near optimum solutions for large scale optimization problems and a search procedure should find some without trying all permutations. Second, no one of the lowest cost solutions is significantly better than a near optimum solution, so searching for the absolute minimum cost is not very efficient. The simulated annealing technique having these properties is applied to the specific problem of optimizing segment placement within precincts. A normalized cost function is generated for the placement of segments, a random placement of segments sets the reference cost, and segments are interchanged until a near optimum solution is found based on the cost function.

The cost function represents the physical design parameters which limit the ability to optimally place the segments in precincts. The cost function is a series of three terms added together to get a total cost. Each term represents a different design parameter. The first term represents the cut cost, the second term represents the precinct cost, and the third term represents the timing cost. Each term is weighted by a user defined option which can be different for each term. The weights are according to the relative importance of each of the physical parameters to the overall optimization of the segment placement.

Figure 11:
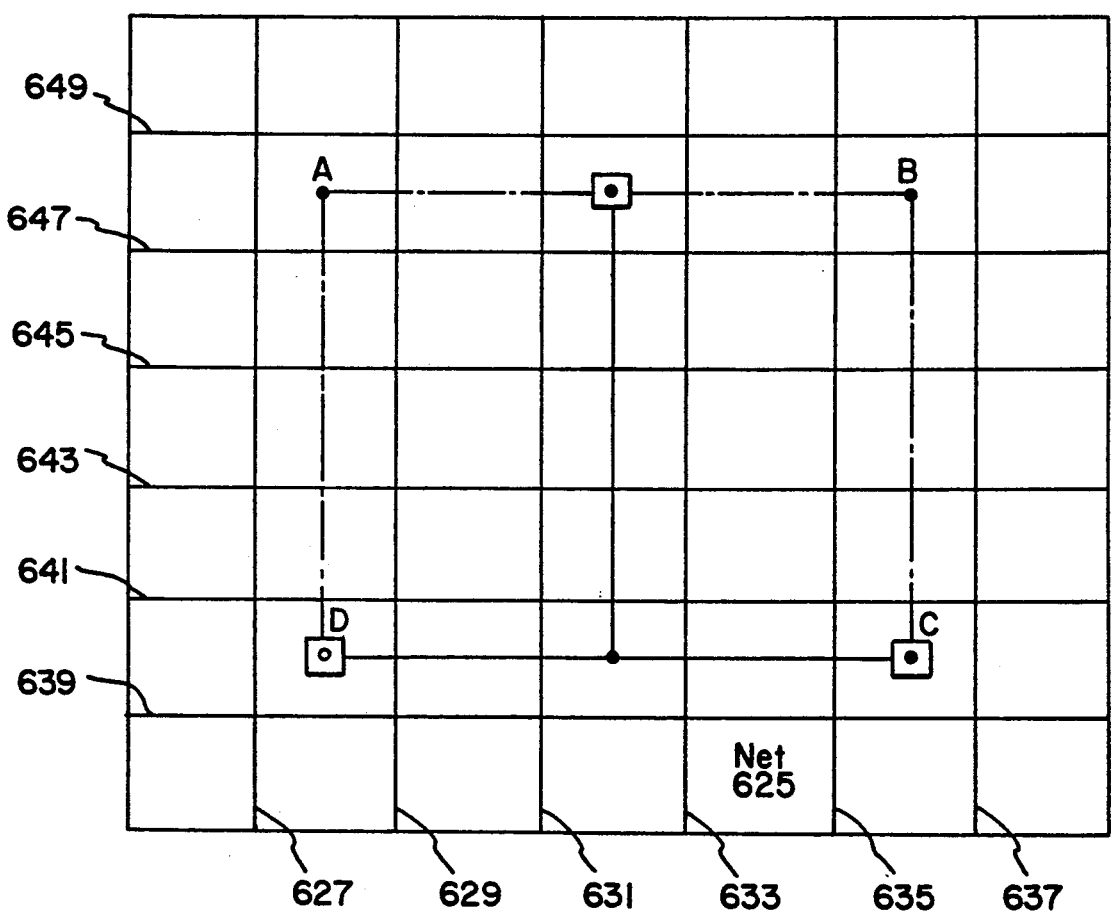
FIG. 11 illustrates cut cost evaluation.

The first term is called the cut cost and is calculated separately for both vertical and horizontal wiring tracks of the logic design. A cut is an imaginary line extending across the chip at precinct boundaries. Thus an image with 10 precinct rows and 12 precinct columns would have 9 horizontal cuts and 11 vertical cuts. A global net crosses a cut if a rectangle, defined by the precinct centers of the precincts which bound the net, spans the cut. For example, FIG. 11 illustrates the 5 precinct by 5 precinct rectangle ABCD which bounds the global net 625. The rectangle spans horizontal cuts 641, 643, 645, and 647, but not 639 or 649. Similarly, the rectangle spans vertical cuts 629, 631, 633, and 635 but not 627 or 637. Cut demand is the number of wiring tracks required for the logic design that cross the cut. Cut cost is the ratio of the number of wiring tracks required divided by the number of tracks available which cross a cut for each horizontal and vertical cut, summed over all the cuts in the design and raised to a user defined power (typically four).

The second cost term is called precinct cost and consists of two parts, a local or within segment cost, and a wiring cost associated with global nets which probably cross through a precinct. Local, or within segment, wiring demand is estimated by translating an average wire length based on the number of circuits, the size of the circuits, and the number of connections within a segment, into an estimate of the number of wiring tracks required for a segment (St). The number of wiring tracks required for a segment (St) divided by the total wiring track capacity for a precinct (known from the physical description of precincts) and raised to a user defined power (typically four) is the local wiring cost.

The number of wiring tracks for a segment (St) is calculated from the number of circuits and the number of connections of each segment which known because of the segment content having been specified. The size of the circuits are obtained from a summation of the size of the blocks within a segment. Rent's rule allows an estimate of the average wire length to block pitch ratio where RBAR (average length/block pitch) is proportional to the total number of logic gates (NAND equivalents) in the segment. This is derived from Rent's rule in which, T (total number of logic terminals for a segment) equals A (average number of terminals per logic gate) times C raised to the power [p]. The power [p] is a constant for this equation and lies between 0.5 and 0.75 depending on the characterization of the logic design. If the logic is highly parallel, then the constant chosen is closer to 0.75. If the logic is highly serial then the constant chosen is closer to 0.5.

In this particular embodiment, p=0.66 and the calculation is as follows:

P(j)=Summation over all blocks of the jth segment of the I/O pins on a block.

Ni(j)=Number of nets for the jth segment.

B(j) = Number of logic blocks in the jth segment.
S1(j) = Summation over i blocks for the jth segment of square root of block size.
S2(j) = Summation over i blocks of square root of block size times P(i).
N1 = [(B(j)(p−0.5))−1]/[4(p−0.5)−1]
N2 = [(B(j)(p−1.5)−1]/[4(p−1.5)−1]
D1 = (1−B(j)**(p−1))
D2 = (1−4**(p−1))

$$RBAR = 0.65*(0.222)*(7*N1 - N2)/(D1/D2)$$

Once the average interconnection length (RBAR) is known, the average track occupation required for a segment is calculated. This is done as follows:

$$SC = [B(j)*S2(j)]/[P(j)*S1(j)]$$

$$G = P(j) - Ni(j)$$

$$St \text{ (Tracks req)} = G * SC * RBAR/[u * (B(j)**0.5)]$$

where u = calibration factor for utilization of total track capacity. By experiment u is approximately 0.5.

The total number of tracks required for a segment can be further broken down into vertical and horizontal tracks required for a segment by estimating that the ratio of vertical to total track capacity for a precinct is the same for the segments. Similarly, the ratio of horizontal to total track capacity for a precinct is the same for the segments. Therefore, HSt (horizontal tracks required/segment) = St * Ht/[Ht+Vt]; where Ht and Vt are the total horizontal and vertical (respectively) track capacity for a precinct which are known from the physical description of the precinct. Also, VSt = St * Vt/[Ht+Vt].

Also:
* is multiplication,
** is raising to a power, and
/ is division.

The probability that a global net crosses a precinct can be calculated because the precincts are organized in a number of rows and columns. A table of binomial coefficients is generated by the following routine:

Do, i=0 to columns-1;
Do, j=0 to rows-1;
If (i=0, or j=0), then B(i,j) = 1;
Else B(i,j) = B(i−1,j) + B(i,j−1);
End;
End;

For each global net between precincts, the total number of paths between precincts with precinct coordinates (c1,r1) and (c2,r2) is calculated as B(k,l);
where: k = absolute value of (c2-c1) and l = absolute value of (r2-r1).

The total number of paths which cross a precinct (i,j) but do not have endpoints in the precinct is:

Paths (i,j) = B(i,j)*B(k-i,l-j); where (i,j) is not equal to (0,0) and (i,j) is not equal to (k,l).

Paths (i,j) is divided into horizontal and vertical paths depending on the value of k and l. If k=0, then Hnets (horizontal paths) = 0, and Vnets (vertical paths) = Paths (i,j). If l=0, then Hnets = Paths (i,j) and Vnets = 0. If k=1, then Hnets and Vnets = 0.5 * Paths (i,j), and so on. The probability of a wire connecting (c1,r1) to (c2,r2) and traversing precinct (i,j) is Paths(i,j) divided by B(k,l).

The calculation of the probabilities for a global net connecting different precincts having a path crossing a particular precinct vertically or horizontally provide the number of total vertical and horizontal global nets crossing any one precinct, Hnets and Vnets respectively. The second part of the precinct cost is the wiring cost for Hnets and Vnets. Horizontal precinct cost (Phc) and vertical precinct cost (Pvc) is the wiring cost for Hnets and is calculated for a given precinct as follows:

Hnets = Total number of global horizontal nets crossing the precinct.
Vnets = Total number of global vertical nets crossing the precinct.

$$Phc = [Hn + Hst] / Ht.$$

$$Pvc = [Vnets + Vst] / Vt.$$

If Phc is less than 1.0, then there is enough wiring tracks available to wire the horizontal portion of the precinct. Similarly if Pvc is less than 1.0, then there is enough wiring tracks available to wire the vertical portion of the precinct. The horizontal and vertical costs from the global nets are added to the local precinct wiring costs to arrive at Phc and Pvc. The total precinct cost is obtained by raising Phc and Pvc for each precinct to a user defined power, typically four, and then summing these terms over all the precincts.

The third cost term is function of the delay of the logic as it is globally placed. The slack terms generated by the equation generation step when the segments are placed in precincts are the basis for this cost term. The slack of the equations is based on the change in delay of terms plus and RC delay summed over all the terms in an equation (i.e., new slack = nominal slack + delay change in the terms + RC delay. The resistance and capacitance terms come from the segment list of the terms, the first segment is the source and the farthest segment allows the estimation of the length). Each slack that is less than a user defined input base slack (nominally zero) is a timing cost with a magnitude equal to the difference between the slack and the base slack for the global net. These differences are summed and raised to some power, nominally 4, to indicate the weighted fraction of the total cost taken by the timing as it is affected by the global wiring.

Figure 7:
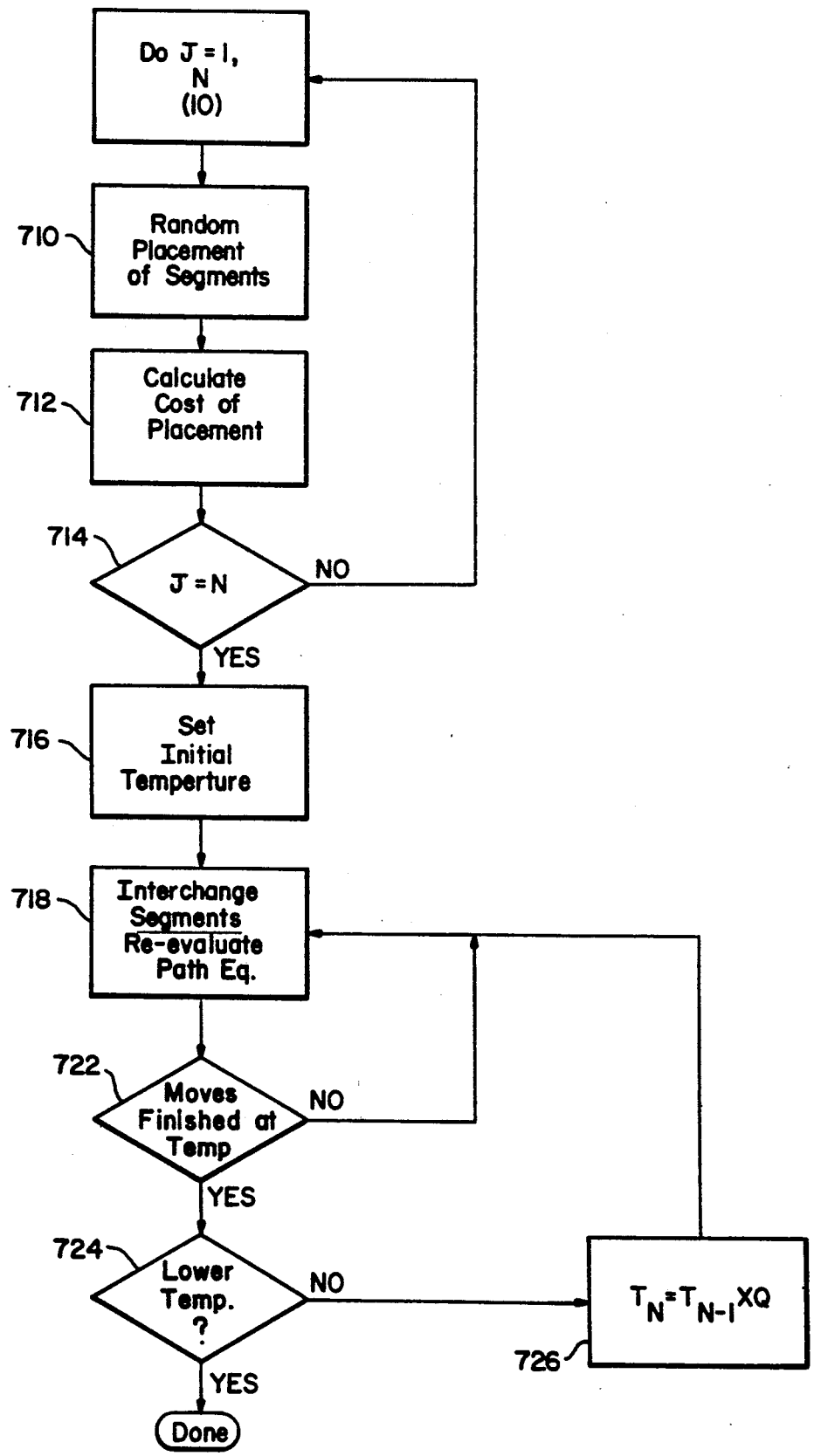
FIG. 7 illustrates the global placement process.

FIG. 7 illustrates how the cost function is used in the global placement 700 process. The initial temperature or reference cost of the global placement is set by randomly placing 710 the segments into precincts a number of times. When a random placement is made, a total cost is calculated 712. Each total cost is squared and added to the square of a number of several other total costs from other random placements. The squares are then summed and the square root of the sum is taken. This value, the root mean square (RMS) of the total costs, is taken as the initial temperature (in units of the cost function) of the global placement 716. In particular, the global placement routine sets the initial temperature by taking the RMS of the total costs for ten 714 (N=10) random placements.

Once the initial temperature (the initial placement being random) is known, the global placement routine sets a test state from the current state of the segment placement by interchanging 2 segments 718 within precincts. This interchange requires that some of the path equations be reevaluated to reflect the changed cost of the new placement of the segments. Specifically, the new delays and resulting slacks associated with the move are used to generate a new cost for the test state. This is done by defining a group of terms from the equation generation step 600 having the same segment list as a PTANET (Parametric Timing Analysis NET). When segments are moved between precincts, all the changed PTANETs are found and a linked list of changed PTANETs is created. Each changed PTANET has a new capacitance associated with the change and allows the creation of a linked list of changed terms.

The changed terms have their delays reevaluated using the capacitance from the PTANET and the equation form to obtain the constants a1, b1, and Ccrit. Each changed term has a change in delay. The changed terms point to all equations which contain them. A linked list of changed equations is generated from the linked list of changed terms. The changed equations have new slack calculated as a result of the changed terms, and the new slack is used to generate a new timing cost. If the new slack from a changed equations is less than a base slack, the difference between the base and new slack is raised to a user defined power (typically four) and added to the timing cost associated with the current state of the segment placement (the contribution of the old slack is subtracted from the cost).

In addition to the timing costs, the wiring costs Phc and Pvc must be reevaluated based on the new wire lengths, from changed global nets, connecting segments. Also, the cut costs must be reevaluated reflecting the change in the global nets. When a total cost for the test state (CS2) has been generated, it is compared to the cost for the current state (CS1). If the test state cost is less than the current state cost, the interchange of segments between precincts is accepted and the test state becomes the current state. If the cost of the test state is greater than the current state, then the move is accepted only if a random number R between 0 and 1 is less than:

$$P = [exp(-(CS2 - CS1)/T(M))].$$

Where T(M) is the temperature. If R is greater than P, the move is not accepted and current state remains the same in the global placement 700 process.

The temperature is a controlling parameter in the global placement routine. At any one temperature T(M), a number of segment moves are attempted until a) an accepted move limit (here 75) is reached, or b) a total move limit (here 300) is reached. This is illustrated by the determination of whether the moves are finished 722 in FIG. 7. When the move is accepted the test state becomes the current state and a new move is attempted which generates a new test state and reevaluation of the path equations. When the move is not accepted, the current state remains as it is. When either the accepted move limit or the total move limit has been reached, the temperature is lowered.

The segments that are chosen to be interchanged in the move between precincts are randomly chosen but must be within a move class. A move class is a group of segments assigned to precincts which are within a predefined distance from each other. This means that the precinct center to center distance cannot be greater than some value for each segment in the move class. In this embodiment, there are five move classes. Class five, allows move from one end of the design to the other. When a first segment is randomly chosen to be moved, the second segment can also randomly be chosen from the rest of the segments in the design. Class four only allows a move of half the distance across the design. When a first segment is randomly chosen, the second segment can only be chosen from those segments in precincts which are less than half the distance of the logic design away from the precinct holding the first chosen segment. Similarly, class three allows a smaller distance of half of the class four distance, class two allows half of the class three distance, and class one allows half of the class two distance.

The temperature is reevaluated 724 after either the maximum number of unacceptable moves at one temperature have been tried or the maximum number of accepted moves has been reached. When the temperature T(M) is not frozen, the temperature T(M) is multiplied by a constant Q which is less than 1 such that $(T(M+1) = Q*T(M))$ 726. The global placement process 700 then sets the move and accept counters back to zero and attempts segment moves again. The size of the decrease in temperature determines how fast the global placement runs out of moves which lower the cost, i.e., the segments have been frozen. The temperature is lowered until there are only minor changes in the cost function as a result of new moves. The number of moves accepted for each temperature is recorded as an indicator of how much design flexibility in global placement with respect to total cost remains for lower temperatures. Once the segment placement has been frozen, the near optimal global placement of segments to precincts is complete.

Once the segments have finally been placed in the precincts from the global placement 700 process, there may still be timing problems within the logical design. This is because the result of global placement 700 is only an optimization of the overall placement of the segments. It does not attempt to optimize every individual net timing. Therefore, there will be some global nets in which the added timing delay from the global placement 700 makes the slack on the net less than the required net slack. The existence of these timing problems are flagged by performing an update of the ITA 240 analysis (similar to that in step 500 but using new existing data for the design) using updated capacitance delays for the changed global nets. the specification of the global placement enables an updated estimate of the wiring capacitance (and therefore delay) of global nets to be made. This global net length estimate is based on a minimum spanning tree calculation in which the length between segments of the global nets is assumed to be the precinct center to precinct center distance.

Figure 8:
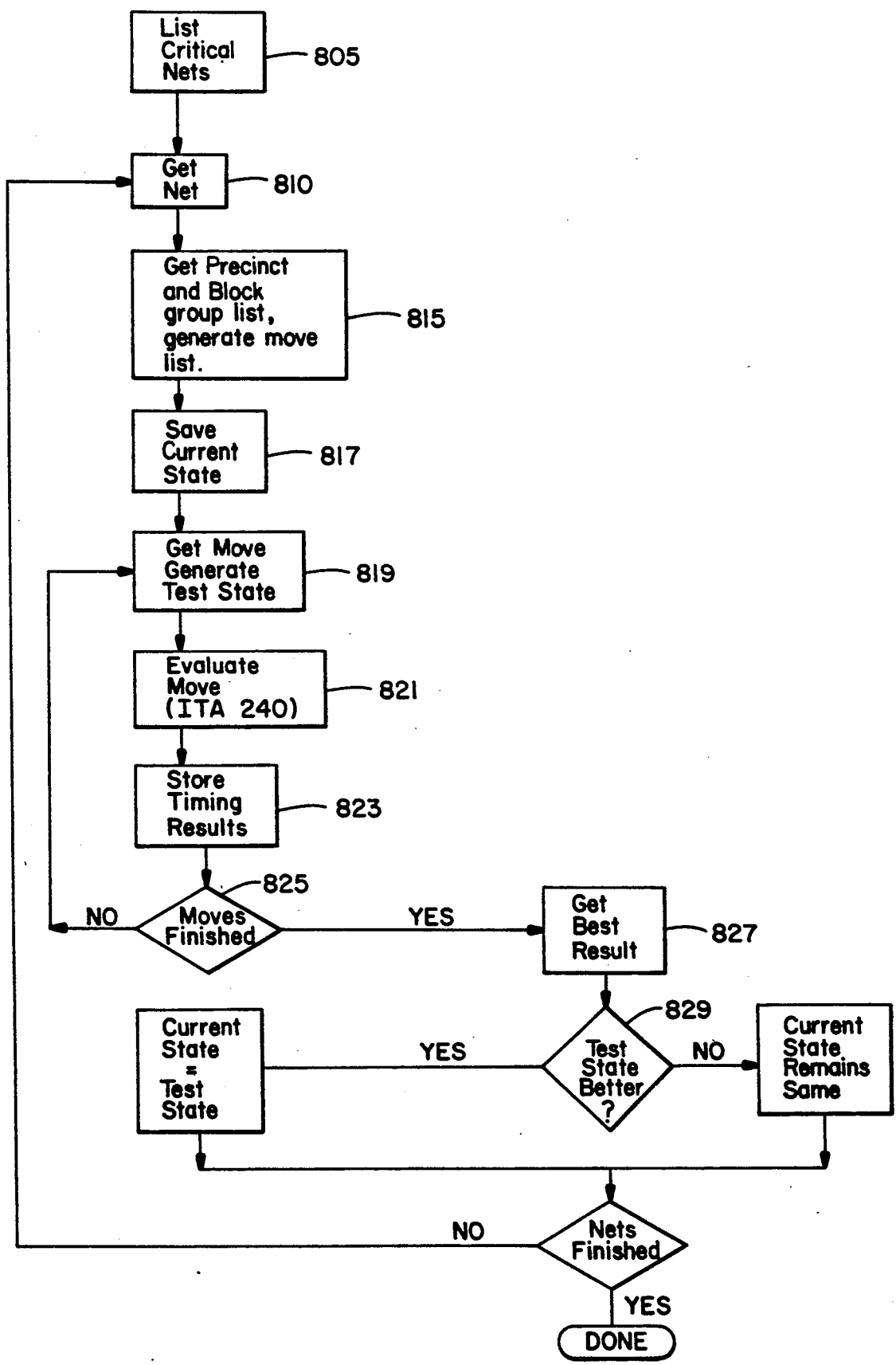
FIG. 8 illustrates the circuit timing process.
Figure 9:
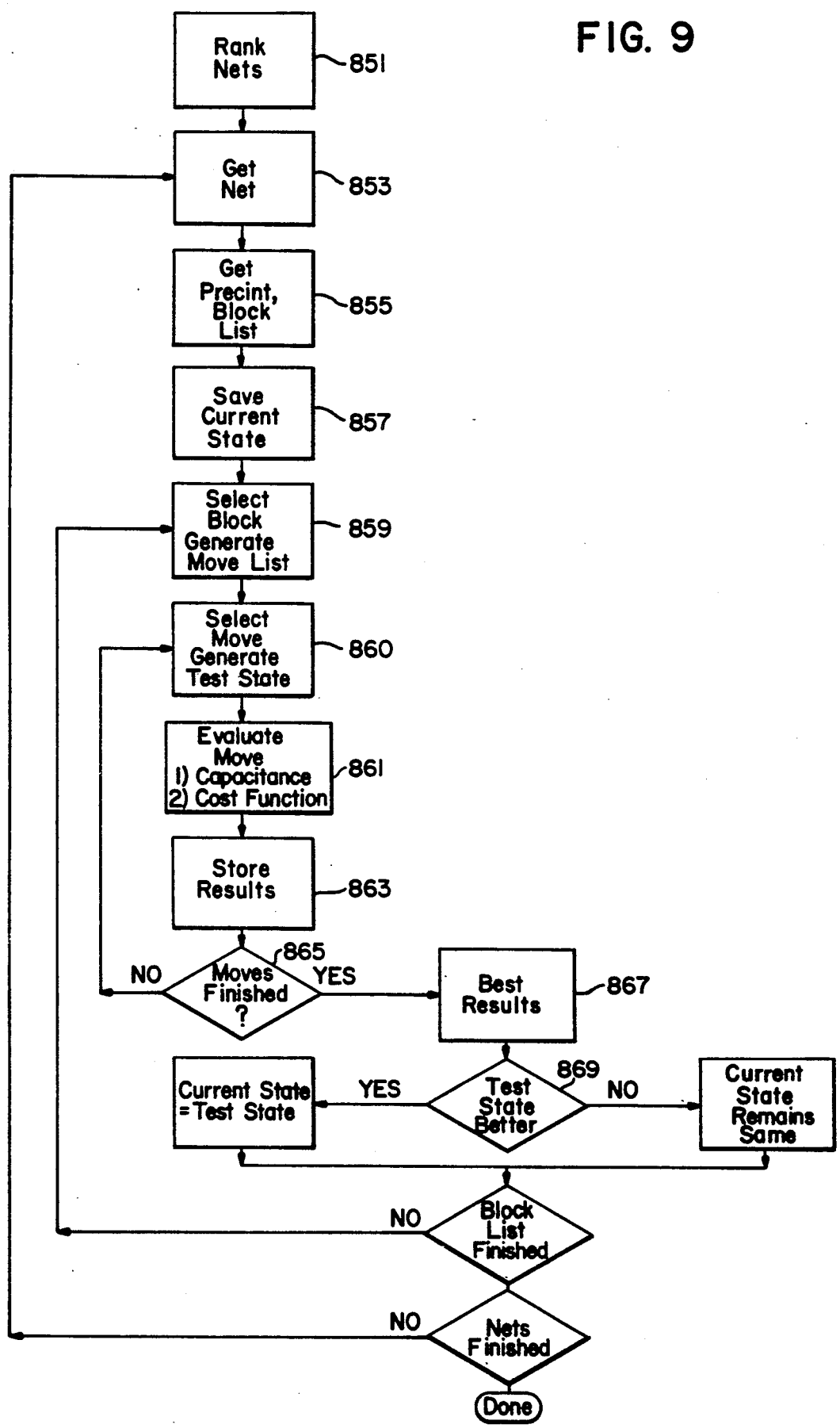
FIG. 9 illustrates the circuit move process.

The Timing Driven Placement design technique alleviates timing problems indicated by the new slack values of the changed paths. This is accomplished through the Circuit Migration 800 process. Circuit Migration consists of two steps, a circuit timing step 801 followed by a circuit move step 850. The circuit timing step is illustrated in FIG. 8. The circuit move step 850 is illustrated in FIG. 9. Circuit timing 801 first creates a list of critical nets 805 which it obtains from the updated ITA 240 analysis of the globally placed segments in precincts. A critical net is one in which the slack of the net is less than a base slack (user defined). Then an analysis of those nets is performed for each net in the list 810. Each net is connected to a set of precincts and a group of blocks within the precincts. The precinct list and the group block list for each net is obtained 815. This enables a move list to be generated in which the group of blocks is moved from one precinct to another on the same net (similar to the move list generated in Segment Improvement 550, for example, precincts A, B, and C have moves A into B, B into C, A and B into C etc.).

Figure 10A:
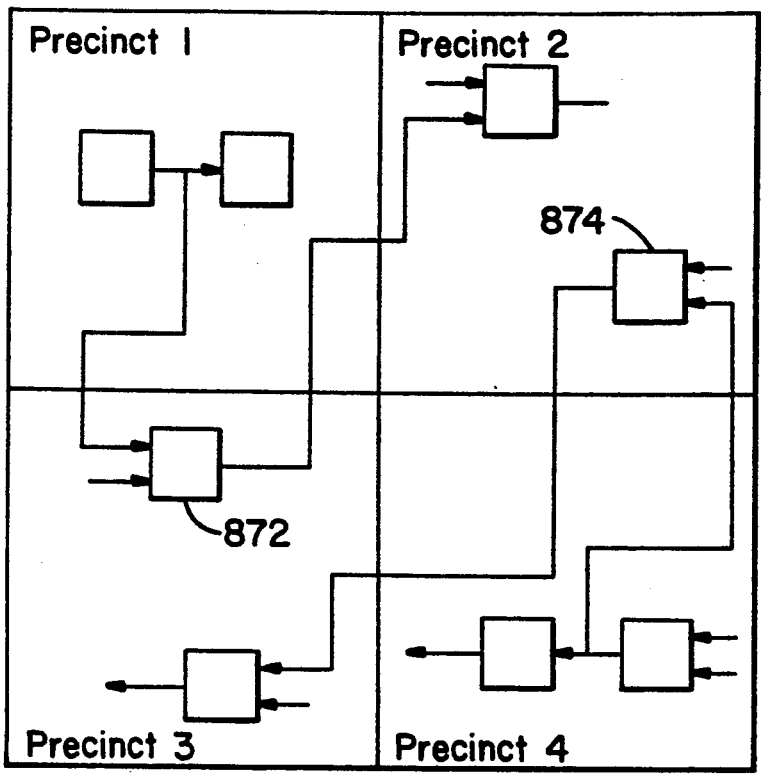
FIGS. 10a and 10b illustrates the logic block movement evaluation.
Figure 10B:
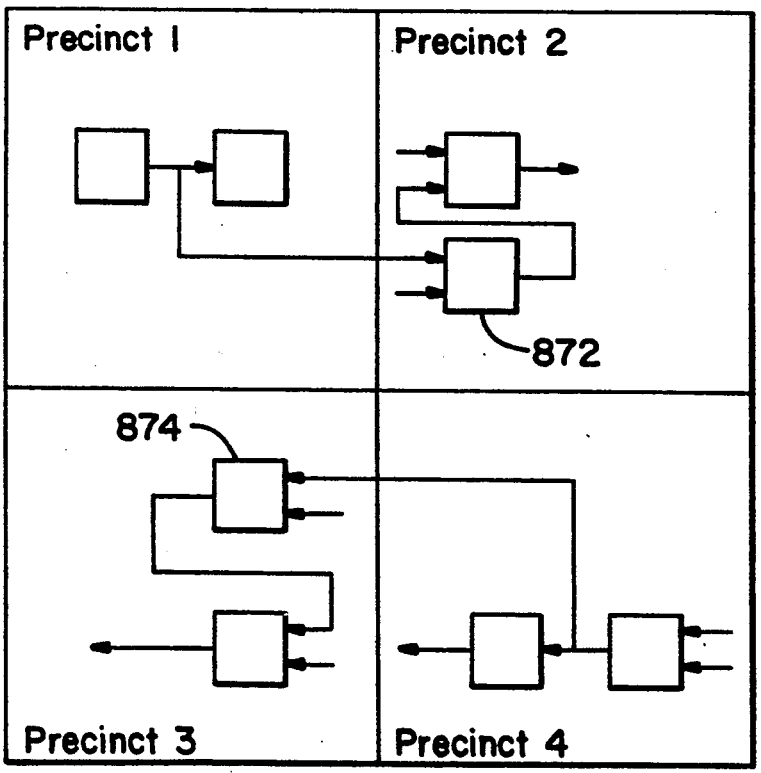

The move list improves the timing of the net by either removing at least one precinct from the net or reducing the capacitance of the net. FIG. 10 illustrates a logic block move which removes a precinct from the net. Block 872 in FIG. 10A is in precinct 3 and the net associated with this block interacts with precincts 1, 2, and 3. Block 874 is in precinct 2 in FIG. 10A and the net associated with this block interacts with precincts 2, 3, and 4. The interchange of blocks 872 in precinct 3 for block 874 in precinct 2 is illustrated in FIG. 10B. The respective nets associated with blocks 872 and 874 only interact with 2 precincts each. The blocks moved between precincts eliminated the need for the net to span an extra precinct. This results in shorter net lengths and less net capacitance.

Once the move list has been generated, the current state of the block assignment to precinct location is saved 817. A move from the move list is selected, and a test state is postulated 819 which implements the move selected. The move creates changes in slack, from updated RC estimates, which are evaluated by ITA 240 in the incremental mode (that is, only changed block input and outputs are evaluated). The slack associated with the move is stored 823. This evaluation is repeated for all the moves on the net 825. The best timing result is selected from the stored timing results 827. If the best timing result is better than the current state, then the move is made so that the test state becomes the current state 829. If the best timing result is not better than the current state, the current state remains as it is. This process is repeated for all the critical nets.

Circuit timing 801 is followed by a process which improves the wireability of the circuits placed in precincts. This process is called circuit move 850 and is illustrated in FIG. 9. Circuit move 850 works similar to circuit timing 801 but evaluates all nets and uses a different evaluation criteria. The process starts by ranking 851 all the nets in the design by their contribution to the wiring cost function from the global placement 700 process as finally placed. Then for each net, the process obtains a precinct list and a block list of all the precincts and blocks attached to the net 855. The current state of the block assignment to precinct location is saved 857. A block attached to the net is then selected 859 and a move list is generated in which the block is moved into the other precincts (as opposed to the precinct that the block is already in) attached to the net.

Once a move list has been generated, the circuit move 850 process creates a test state by selecting one of the moves 860. The test state is evaluated 861 based on two criteria. First, whether the move adds capacitance to any net having critical slack. If the move adds capacitance to such a net the move is not made and the test state is not created. If the move does not, then the move is evaluated for whether it decreases the wiring cost function. The wiring cost function illustrated in the Global Placement 700 process is recalculated for the new block placement into the precincts. The results of this calculation are then stored 863, the current state recalled, a new move is selected, and a new test state generated. When all the moves for a block are finished 865, the best (lowest) cost function for the test states is selected 867. If the wiring cost of the associated test state is lower than the wiring cost of the current state 869, then the move is made and the test state becomes the current state. If not, the current state remains as it is.

This process is repeated for all the blocks on a net and all the nets.

When the circuit migration is complete, the assignment of globally placed and migrated circuits to precinct locations is complete. The timing driven placement process provides two optimized assignment schedules. First, the precinct location on the overall chip design, and second, an assignment of blocks to precincts. These assignment schedules are then fed to a conventional automated circuit placement and wiring process which has the capability to handle the detailed placement and wiring process associated with the circuit assignment.

The precinct assignment schedule can be optionally modified by the detailed placement process because of the formal hierarchy of the precinct assignment schedule. This provides for a more efficient detailed placement of the precincts. A first modification, as an example, is to allow adjacent precinct edges to overlap in the physical placement of the precinct. This could be used to alleviate specific wiring congestion. A second modification is to allow only blocks on nets with critical timing to be physically placed via the assignment schedule. The remaining blocks with non-critical timing could be conventionally placed with the detailed placement process because their timing is not critical. These types of modifications in the assignment schedule provide greater flexibility to the detailed placement program in physically placing the precincts in the design.

While this invention has been particularly described and illustrated with reference to a preferred embodiment thereof, it will be understood by those skilled in the art that changes in the above description or illustrations may be made with respect to form or detail without departing from the spirit and scope of the invention.

We claim:

1. A method for determining placement of circuit elements, comprising the steps of:
    describing a circuit in a formal hierarchy, said formal hierarchy describing block placement in said circuit;
    generating path equations, said path equations representing delays on global nets determining slack from said formal hierarchy and said path equations:
    optimizing said slack;
    placing a plurality of blocks in a circuit according to said optimization of said slack.

2. A method for determining placement of circuit elements as in claim 1, wherein said formal hierarchy description:
    describes said circuit in logical block form, said logical block form containing a plurality of logical blocks interconnected by a plurality of nets;
    describes a physical space within which to design an integrated circuit;
    partitions said logical block form into a plurality of segments, each of said segments containing a plurality of logical blocks, each of said segments connected to other segments by global nets;
    partitions said physical space into a plurality of precincts; and
    randomly assigns each of said segments to one of said precincts.

3. A method for determining placement of circuit elements as in claim 2, wherein:
    each of said path equations includes a plurality of terms, said terms list a plurality of segments attached to a common global net to estimate capacitance associated with said common global net; and said plurality of terms are minimized, said term minimization retaining a signal term when at least two terms have an identical plurality of said segments.

4. A method for determining placement of circuit elements as in claim 3, wherein:

said list of segments has a first segment designated as a driver segment; and said term minimization retains a single term when at least two terms have an identical plurality of said segments and said drivers are identical.

5. A method for determining placement of circuit elements as in claim 2, wherein:

each of said path equations include a plurality of terms, said terms list a plurality of segments attached to a common global net to estimate capacitance associated with said common global net;

said plurality of terms are minimized; and said minimized terms are used to calculate an arrival time for each of said path equations, sorting said path equations with respect to said arrival time, and eliminating said equations having said arrival time greater than a user defined limit.

6. A method for determining placement of circuit elements as in claim 2, wherein said slack optimization comprises:

evaluating said slack as a cost function, said cost function efficiently evaluating timing and wiring changes in said circuit design; and modifying said circuit placement to minimize said cost function.

7. A method for determining placement of circuit elements as in claim 6, wherein said minimization of said cost function comprises:

modifying said circuit placement when said modification lowers said cost function; and having a probability greater than zero of modifying said circuit placement when said modification raises said cost function.

8. A method for determining placement of circuit elements, comprising the steps of:

describing said circuit in logical form, said logical block form containing a plurality of logical blocks interconnected by a plurality of nets;

describing a physical space within which to design an integrated circuit;

partitioning said logical block form into a plurality of segments, each of said segments containing a plurality of logical blocks, each of said segments connected to other segments by global nets;

partitioning said physical space into a plurality of precincts;

randomly assigning each of said segments to one of said precincts;

generating path equations, said path equations representing delays on said global nets as a function of said segments assignment to said precincts;

determining slack from said path equations;

optimizing said slack, said slack optimization interchanging a plurality of segments between said assigned precincts, said slack optimization utilizing said path equations to measure said slack, said measurement expressed in a cost function, said cost function efficiently evaluating timing and wiring changes in said circuit design from said segment interchanges, said slack optimization minimizing said cost function, said slack optimization indicating a final assignment of said segments to said precincts when said slack is optimized; and placing said segments into said precincts indicated by said final assignment.

9. A method for determining placement of circuit elements as in claim 8, wherein;

said evaluation of said wiring changes measures cut cost and precinct cost of said element placement.

10. A method for determining placement of circuit elements comprising the steps of:

assigning logic blocks to a plurality of segments, said segments interconnected by a plurality of nets;

calculating slack associated with said plurality of nets;

selecting a plurality of critical nets based on slack;

evaluating a plurality of logic block moves between said segments for each of said critical nets, said evaluation determining a new net slack for each of said moves;

selecting a move for each critical net which provides the largest improvement in slack; and making said selected block move when said new net associated with said block move has a larger slack than said critical net slack.

11. A method for determining placement of circuit elements comprising the steps of:

assigning logic blocks to a plurality of precincts, said precincts interconnected by a plurality of nets;

calculating slack associated with each of said plurality of nets;

identifying a plurality of critical nets based on said slack;

evaluating a plurality of logic block moves between precincts for each of said critical nets, said evaluation determining a new slack for each of said moves;

selecting a block move for each critical net which provides the largest improvement in slack; and making said selected block move when said new net associated with said block move has a larger slack than said critical net slack.

12. A method for determining placement of circuit elements comprising the steps of:

assigning logic blocks to a plurality of precincts, said precincts interconnected by a plurality of nets;

calculating slack associated with each of said plurality of nets;

sorting said plurality of nets by a slack;

evaluating a plurality of logic block moves between precincts for each of said plurality of nets to determine capacitance and wiring cost;

selecting a block move for each net which provides the lowest cost; and making said selected block move when said capacitance associated with said move is not increased on a critical net.

13. A method for determining placement of circuit elements as in claim 12, wherein aid wiring cost comprises:

cut cost and precinct cost.

14. A method for determining placement of circuit elements comprising the steps of:

assigning logic blocks of said circuit elements to a plurality of precincts forming a circuit;

optimizing said logic block placement within said precincts;

optimizing said precinct placement in said circuit to enhance wiring, said precinct placement optimization overlapping precinct edges.

15. A method for determining placement of circuit elements comprising the steps of:
assigning logic blocks of said circuit elements to a plurality of precincts, said precincts interconnected by a plurality of nets, said nets interconnect a plurality of logic blocks, said precincts forming a circuit;
optimizing said logic block placement within said precincts, said optimization placing logic blocks associated with critical nets within said precincts; and
optimizing said precinct placement in said circuit to enhance wiring, said precinct placement optimization overlapping precinct edges.

16. A method for determining placement of circuit elements, comprising the steps of:
describing said circuit elements in logical block form, said logical block form containing a plurality of logical blocks interconnected by a plurality of nets;
describing a physical space within which to design an integrated circuit;
partitioning said logical block form into a plurality of segments, each of said segments containing a plurality of logical blocks, each of said segments connected to other segments by global nets;
calculating slack associated with said plurality of global nets;
selecting a plurality of critical nets from said global based on slack;
evaluating a plurality of logic block moves between said segments for each of said critical nets, said evaluation determining a new net slack for each of said moves;
selecting a move for each critical net which provides the largest improvement in slack;
making said selected block move when said new net associated with said block move has a larger slack than said critical net slack.
partitioning said physical space into a plurality of precincts;
initially assigning each of said segments to one of said precincts;
generating path equations, said path equations representing delays on said global nets as a function of said segments assignment to said precincts;
determining slack from said path equations;
optimizing said slack, said optimization interchanging a plurality of segments between said assigned precincts, said optimization utilizing said path equations to measure said slack, said measurement being expressed in a cost function, said cost function efficiently evaluating timing and wiring changes in said circuit design, said optimization minimizing said cost function, said optimization indicating a final assignment of said segments to said precincts when said slack is optimized;
placing said segments into said precincts indicated by said final assignment;
moving at least one logic block on a net between precincts connected by the net, said movement improving slack associated with said net, and
moving at least one logic block between precincts when said move does not increase capacitance on said net and when said move improves precinct wiring.

17. A system for placing circuit elements, comprising:
a database means for storing a description of a circuit, said description containing placement information of a plurality of logic blocks within said circuit, said logic blocks interconnected by nets;
a logical partitioning means for separating said plurality of logic blocks into a plurality of segments, said segments interconnected by global nets;
a path equation generation means for generating path equations representing delays on said global nets;
a slack determining means for determining slack from said path equations and said circuit description;
a global placement means for optimizing said slack; and
a circuit migration means for physically placing said plurality of logic blocks in said circuit.

18. A system for placing circuit elements, as in claim 17, wherein said path equation generation means:
generates a plurality of terms, said terms list a plurality of segments attached to a common global net to estimate capacitance associated with said common global net; and
minimizes said plurality of terms, said term minimization retaining a single term when at least two terms have an identical plurality of said segments.

19. A system for placing circuit elements, as in claim 17, wherein said path equation generation means:
generates a plurality of terms, said terms list a plurality of segments attached to a common global net to estimate capacitance associated with said common global net, said list of segments having a first segment designated as a driver segment; and
minimizes said plurality of terms, said term minimization retaining a single term when at least two terms have an identical plurality of said segments and said drivers are identical.

20. A system for placing circuit elements, as in claim 17, wherein said logical partition means:
calculates slack associated with said plurality of global nets;
selects a plurality of critical nets based on slack;
evaluates a plurality of logic block moves between said segments for each of said critical nets, said evaluation determines a new net slack for each of said moves;
selects a move for each critical net which provides the largest improvement in slack; and
makes said selected move when said new net associated with said block move has a larger slack than said critical net slack.

21. A system for placing circuit elements, as in claim 17, wherein:
said database storage means stores an assignment of logic blocks to a plurality of precincts, said precincts interconnected by a plurality of nets;
said circuit migration means calculates slack associated with each of said plurality of nets;
said circuit migration means selects a plurality of critical nets based on said slack;
said circuit migration means evaluates a first plurality of logic block moves between said plurality of precincts for each of said critical nets, said evaluation determines a new net slack for each of said moves;
said circuit migration means selects a logic block move for each critical net which provides the largest improvement in slack; and
said circuit migration means makes said selected move when said new net associated with said selected move has a larger slack than said critical net slack.

22. A system for placing circuit elements, as in claim 17, wherein said circuit migration means:
- sorts said plurality of nets by slack;
- evaluates a second plurality of logic block moves between precincts for each of said plurality of nets to determine capacitance, timing cost, and wiring cost;
- selects a block move for each net which provides the lowest wiring cost; and
- makes said selected block move when said capacitance on critical nets associated with said move is not increased.

23. A system for placing circuit elements, comprising:
- a data base storage means for storing an assignment of logic blocks to a plurality of precincts, said precincts interconnected by a plurality of nets;
- a calculating means for calculating slack associated with each of said plurality of nets;
- a first selection means for selecting a plurality of critical nets based on said slack;
- an evaluation means for evaluating a plurality of logic block moves between said plurality of precincts for each of said critical nets, said evaluation determines a new net slack for each of said moves;
- a second selection means for selecting a logic block move for each critical net which provides the largest improvement in slack; and
- a movement means for making said selected move when said new net associated with said selected move has a larger slack than said critical net slack.

24. A system for placing circuit elements, comprising:
- a data base storage means for storing an assignment of logic blocks to a plurality of precincts, said precincts interconnected by a plurality of nets;
- a calculating means for calculating slack associated with each of said plurality of nets;
- a sorting means for sorting said nets by slack;
- an evaluation means for evaluating a plurality of logic block moves between precincts for each of said plurality of nets to determine capacitance, timing cost, and wiring cost;
- a selection means for selecting a block move for each net which provides the lowest wiring cost; and
- a movement means for making said selected block move when said capacitance on critical nets associated with said move is not increased.

* * * * *

UNITED STATES PATENT AND TRADEMARK OFFICE
CERTIFICATE OF CORRECTION

PATENT NO. : 5,218,551
DATED : June 8, 1993
INVENTOR(S) : B. Agrawal, et. al.

It is certified that error appears in the above-indentified patent and that said Letters Patent is hereby corrected as shown below:

Column 22, Claim 12, line 53 after "lowest", insert --wiring--.

Column 22, Claim 13, line 57 delete "aid" and insert --said--.

Column 22, Claim 14, line 63 after "precincts", insert --said precincts--.

Column 25, Claim 22, line 2 delete "17" and insert --21--.

Signed and Sealed this

Eleventh Day of January, 1994

Attest:

BRUCE LEHMAN

Attesting Officer     Commissioner of Patents and Trademarks